(12) United States Patent
Kikuchi

(10) Patent No.: US 7,542,341 B2
(45) Date of Patent: Jun. 2, 2009

(54) MIS-TRANSISTOR-BASED NONVOLATILE MEMORY DEVICE WITH VERIFY FUNCTION

(75) Inventor: Takashi Kikuchi, Fukuoka (JP)

(73) Assignee: NSCORE, Inc., Fukuoka (JP)

( * ) Notice: Subject to any disclaimer, the term of this patent is extended or adjusted under 35 U.S.C. 154(b) by 109 days.

(21) Appl. No.: 11/841,265

(22) Filed: Aug. 20, 2007

(65) Prior Publication Data

US 2009/0052229 A1 Feb. 26, 2009

(51) Int. Cl.
 *G11C 11/34* (2006.01)
(52) U.S. Cl. .................. 365/185.08; 365/156
(58) Field of Classification Search .......... 365/185.08, 365/156, 185.22
 See application file for complete search history.

(56) References Cited

U.S. PATENT DOCUMENTS

| | | | | |
|---|---|---|---|---|
| 3,636,530 | A | 1/1972 | Mark et al. ............. | 365/228 |
| 4,419,744 | A | 12/1983 | Rutter ............... | 365/154 |
| 5,682,345 | A * | 10/1997 | Roohparvar et al. ... | 365/185.04 |
| 5,956,269 | A | 9/1999 | Ouyang et al. ......... | 365/185.09 |
| 6,038,168 | A | 3/2000 | Allen et al. ............ | 365/185.07 |
| 6,064,590 | A | 5/2000 | Han et al. | |
| 6,249,479 | B1 * | 6/2001 | Tanzawa et al. ........ | 365/230.06 |
| 6,363,011 | B1 * | 3/2002 | Hirose et al. ........... | 365/185.07 |
| 6,469,930 | B1 * | 10/2002 | Murray ................. | 365/185.08 |
| 6,740,927 | B1 | 5/2004 | Jeng | |
| 6,906,953 | B2 | 6/2005 | Forbes ................. | 365/185.03 |
| 6,906,962 | B2 | 6/2005 | Layman et al. ........ | 365/189.01 |
| 6,909,635 | B2 | 6/2005 | Forbes et al. .......... | 365/174 |
| 7,227,234 | B2 | 6/2007 | Roizin et al. | |
| 2004/0232477 | A1 | 11/2004 | Iwata et al. | |
| 2004/0252254 | A1 | 12/2004 | Koo et al. | |

FOREIGN PATENT DOCUMENTS

| | | |
|---|---|---|
| JP | 6-76582 | 3/1994 |
| JP | 6-231587 | 8/1994 |
| JP | 2001-156188 | 6/2001 |
| JP | 2002-237540 A | 8/2002 |
| WO | 2004/057621 A1 | 7/2004 |
| WO | 2006/093629 A1 | 9/2006 |

* cited by examiner

*Primary Examiner*—Anh Phung
(74) *Attorney, Agent, or Firm*—Ladas & Parry LLP

(57) ABSTRACT

A nonvolatile semiconductor memory device includes a first latch to store data, a nonvolatile memory cell including two MIS transistors to store data as an irreversible change of transistor characteristics occurring in one of the two MIS transistors selected in response to the data stored in the first latch, a second latch to store data obtained by sensing a difference in the transistor characteristics between the two MIS transistors, a logic circuit to produce a signal indicative of comparison between the data of the first latch and the data of the second latch, and a control circuit configured to repeat a store operation storing data in the nonvolatile memory cell, a recall operation storing data in the second latch, and a verify operation producing the signal indicative of comparison until the signal indicates that the data of the first latch and the data of the second latch are the same.

7 Claims, 19 Drawing Sheets

MIS-TRANSISTOR-BASED NONVOLATILE MEMORY DEVICE WITH VERIFY FUNCTION

BACKGROUND OF THE INVENTION

1. Field of the Invention

The present invention generally relates to a memory circuit, and particularly relates to a nonvolatile memory circuit which is capable of retaining stored data in the absence of a power supply voltage.

2. Description of the Related Art

Nonvolatile semiconductor memory devices, which can retain stored data even when power is turned off, conventionally include flash EEPROM employing a floating gate structure, FeRAM employing a ferroelectric film, MRAMs employing a ferromagnetic film, etc. There is a new type of nonvolatile semiconductor memory device called PermSRAM. PermSRAM uses a pair of MIS (metal-insulating film-semiconductor) transistors as a nonvolatile memory cell (i.e., the basic unit of data storage). The MIS transistors used as a nonvolatile memory cell in PermSRAM have the same structure as ordinary MIS transistors used for conventional transistor functions (e.g., switching function), and do not require a special structure such as a floating gate or a special material such as a ferroelectric material or ferromagnetic material. The absence of such a special structure and special material offers an advantage in cost reduction. PermSRAM was initially disclosed in PCT/JP2003/016143, which was filed on Dec. 17, 2003, the entire contents of which are hereby incorporated by reference.

The pair of MIS transistors used as a nonvolatile memory cell in PermSRAM are configured to selectively experience an irreversible hot-carrier effect on purpose for storage of one-bit data. Here, the irreversible hot-carrier effect refers to the injection of electrons into an oxide film of a selected transistor, which creates a shift in the threshold voltage of this transistor A difference in the transistor characteristics (i.e., difference in the threshold voltage) between the two MIS transistors caused by the hot-carrier effect represents one-bit data "0" or "1". Such a difference may be detected as a difference in the ON current between the two MIS transistors by using a sensing circuit such as a one-bit static memory circuit (latch) coupled to the MIS transistor pair.

In order to store data in a pair of MIS transistors, it is necessary to create a detectable difference in the threshold voltages. Each MIS transistor has its own transistor characteristics, depending on which the time required to create a detectable change in the threshold voltage varies. Some MIS transistors may require a significant amount of time in order for a detectable shift in the threshold voltage to be created. Other MIS transistors may require only a short period of time in order for such shift to be created. In other words, the time required to store data in a memory cell comprised of a pair of MIS transistors varies depending on the memory cell, and thus has a certain distribution range. In order to make sure that data is reliably stored in a given memory cell, generally, a time length that is sufficient even for a worst-case memory cell to safely store data needs to be spent for the process of storing data in this given memory cell. Such configuration operating with a safety margin designed for the worst case memory cell, however, is not efficient.

There is thus a need for PermSRAM that can efficiently store data in an optimum store time.

SUMMARY OF THE INVENTION

It is a general object of the present invention to provide a nonvolatile semiconductor memory device that substantially obviates one or more problems caused by the limitations and disadvantages of the related art.

It is another and more specific object of the present invention to provide a PermSRAM that can efficiently store data in an optimum store time.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a nonvolatile semiconductor memory device particularly pointed out in the specification in such full, clear, concise, and exact terms as to enable a person having ordinary skill in the art to practice the invention.

To achieve these and other advantages in accordance with the purpose of the invention, the invention provides a nonvolatile semiconductor memory device includes a first latch configured to store data, a nonvolatile memory cell coupled to the first latch and including two MIS transistors to store data as an irreversible change of transistor characteristics occurring in one of the two MIS transistors selected in response to the data stored in the first latch, a second latch coupled to the nonvolatile memory cell and configured to store data obtained by sensing a difference in the transistor characteristics between the two MIS transistors of the nonvolatile memory cell, a logic circuit configured to produce a signal indicative of comparison between the data stored in the first latch and the data stored in the second latch, and a control circuit configured to repeat a store operation for storing data in the nonvolatile memory cell, a recall operation for storing data in the second latch, and a verify operation for producing the signal indicative of comparison until the signal indicates that the data stored in the first latch and the data stored in the second latch are the same.

According to at least one embodiment of the present invention, the control circuit performs an automatic store-&-verify operation on its own without requiring specific instructions corresponding to the respective store, recall, and verify operations to be supplied from the host device. All that needs to be done by the host device is to make signal settings indicative of the store-&-verify operation and to wait until a busy signal is negated. Since the store-&-verify operation of the present invention performs store operations no more than necessary to store data in a nonvolatile memory cell, the time required for the store operation is optimized as opposed to the conventional store operation that is performed by providing all the memory cells with the same safety margin designed for the worst case memory cell.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments of the present invention will be described with reference to the accompanying drawings.

The present invention is directed to PermSRAM. Namely, a memory cell includes a pair of MIS (metal-insulating film-semiconductor) transistors that have the same structure as ordinary MIS transistors used for conventional transistor functions (e.g., switching function). Namely, these memory cell transistors use neither a special structure such as a floating gate nor a special material such as a ferroelectric material or a ferromagnetic material. These MIS transistors are configured to experience a hot-carrier effect on purpose for storage of one-bit data.

The hot-carrier effect leaves an irreversible lingering change in the transistor characteristics. Changes in the characteristics of the MIS transistors caused by the hot-carrier effect achieve a nonvolatile data retention. Which one of the MIS transistors has a strong lingering change determines whether the stored data is "0" or "1".

Further, a latch (flip-flop) circuit is used to determine data to be stored in the memory-cell MIS transistors. Another latch circuit is used to read (sense) the data stored in the memory-cell MIS transistors. These latch circuits and the memory-cell MIS transistors together constitute a memory cell unit (memory circuit).

Figure 1:
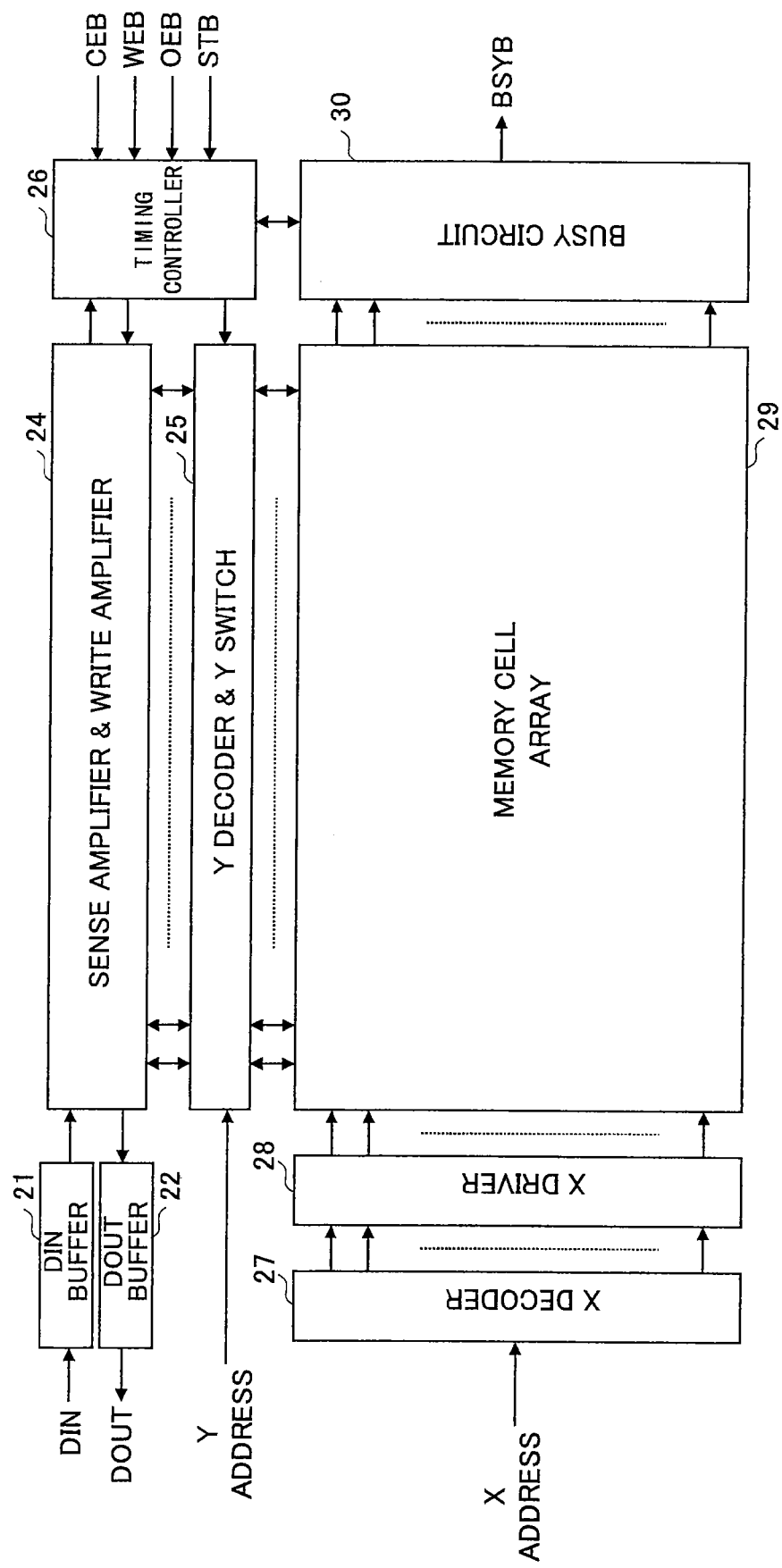
FIG. 1 is a block diagram showing an example of the configuration of a nonvolatile semiconductor memory device according to the present invention.

FIG. 1 is a block diagram showing an example of the configuration of a nonvolatile semiconductor memory device according to the present invention. A semiconductor memory device 20 shown in FIG. 1 includes a Din buffer 21, a Dout buffer 22, a sense-amplifier-&-write-amplifier unit 24, a Y-decoder-&-Y-switch unit 25, a timing controller 26, an X decoder 27, an X driver 28, a memory cell array 29, and a busy circuit 30.

The memory cell array 29 includes a plurality of memory cell units arranged in a matrix form, with a plurality of word lines extending in a first direction, and a plurality of bit lines extending in a second direction perpendicular to the first direction. Each memory cell unit has a circuit configuration as will later be described. The memory cell units arranged in the same column are connected to the same bit lines, and the memory cell units arranged in the same row are connected to the same word line.

The timing controller 26 receives control signals from outside the device, and decodes the control signals to determine an operation mode (e.g., a write operation mode or a read operation mode). These control signals include a store enable signal STB, an output enable signal OEB, a write enable signal WEB, and a chip enable signal CEB. Timing control signals responsive to the determined operation mode are supplied from the timing controller 26 to the sense-amplifier-&-write-amplifier unit 24, the Y-decoder-&-Y-switch unit 25, the X decoder 27, the X driver 28, and the busy circuit 30 for control of the individual parts of the semiconductor memory device 20. For the sake of clarity of illustration, signal lines between the timing controller 26 and each of the X decoder 27 and the X driver 28 are not shown in FIG. 1.

The X decoder 27 receives an X address input from outside the device, and decodes the X address input to determine a selected row. In response to the timing control signals from the timing controller 26 and the decode signals from the X decoder 27, the X driver 28 activates a selected SRAM word line among the SRAM word lines extending from the X driver 28. As a result of the activation of the selected SRAM word line, volatile memory cells (i.e., the latch circuits of memory cells) are coupled to respective bit line pairs. Through this coupling, the writing/reading of data to/from the volatile memory cells is performed.

Data read from the memory cell array 29 is supplied to the sense-amplifier-&-write-amplifier unit 24 via the Y-decoder-&-Y-switch unit 25. Sense amplifiers of the sense-amplifier-&-write-amplifier unit 24 amplify the data read supplied from the memory cell array 29 for provision to the Dout buffer 22. The data is output from the Dout buffer 22 to outside the device as output data DOUT. Input data DIN supplied to the Din buffer 21 is provided to the sense-amplifier-&-write-amplifier unit 24. Write amplifiers of the sense-amplifier-&-write-amplifier unit 24 amplify the input data for provision to the memory cell array 29 via the Y-decoder-&-Y-switch unit 25.

Figure 2:
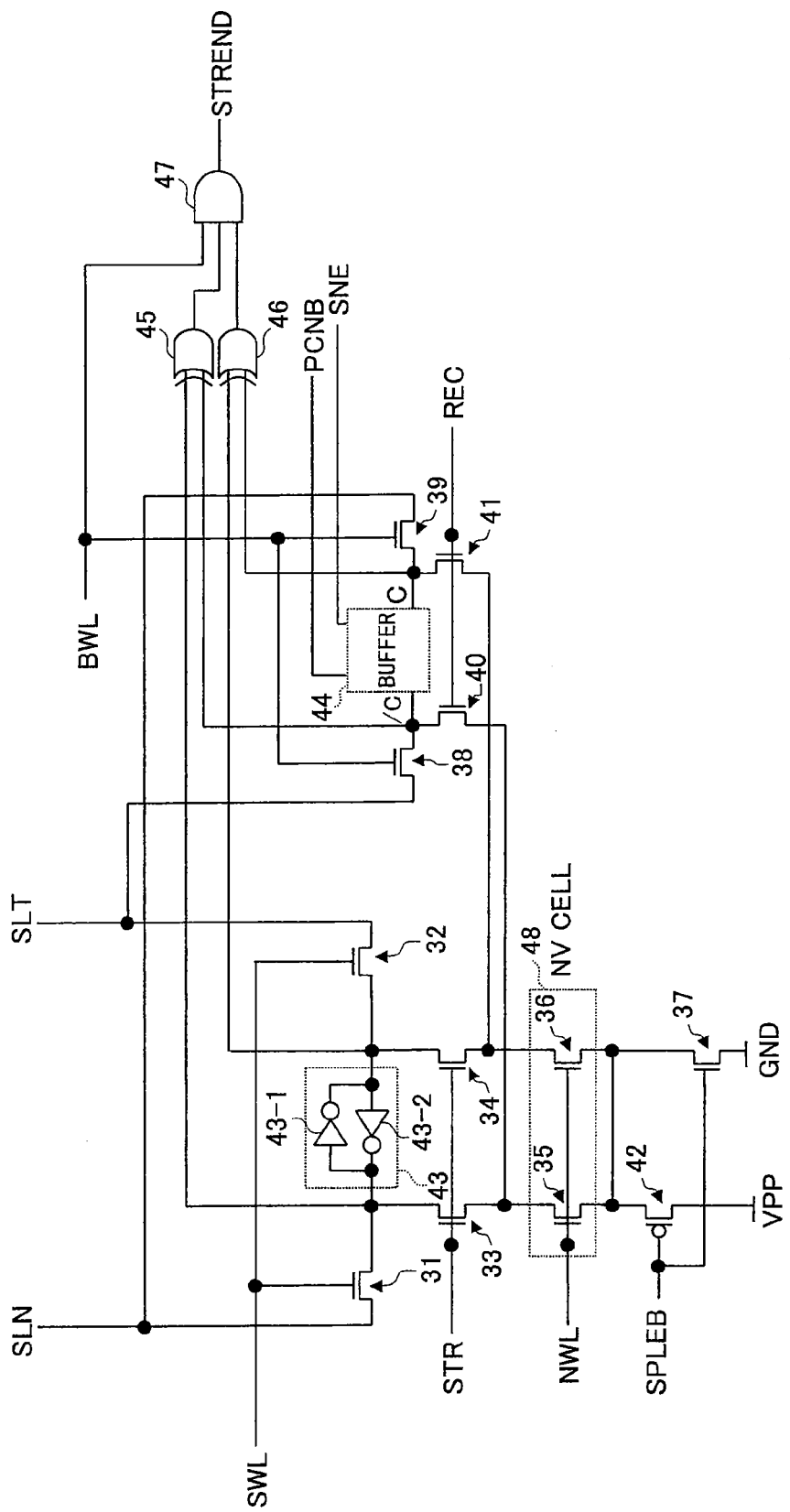
FIG. 2 is an illustrative drawing showing the configuration of a memory cell unit according to an embodiment of the nonvolatile memory device of the present invention.

FIG. 2 is an illustrative drawing showing the configuration of a memory cell unit according to an embodiment of the nonvolatile memory device of the present invention.

A memory cell unit includes NMOS transistors 31 through 41, a PMOS transistor 42, an SRAM cell 43, a buffer 44, XOR gates 45 and 46, and an AND gate 47. A pair of NMOS transistors 35 and 36 constitutes an NV cell 48, which serves as a nonvolatile memory cell for storing one-bit data. The SRAM cell 43 includes inverters 43-1 and 43-2 that are cross-coupled, and serves as a latch circuit for storing one-bit data that is to be stored in the NV cell 48. The buffer 44 serves as a sense circuit to sense data stored in the NV cell 48.

Figure 3:
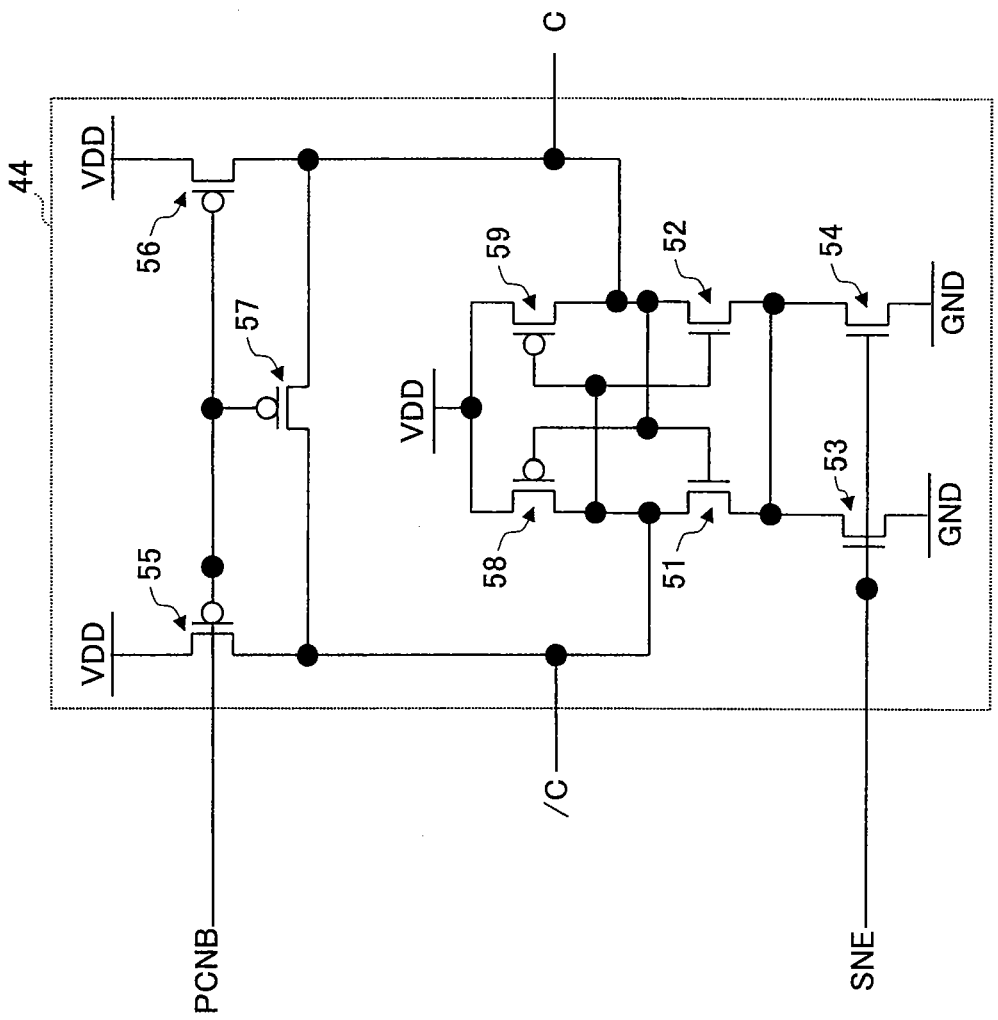
FIG. 3 is a drawing showing an example of the configuration of a buffer shown in FIG. 2.

FIG. 3 is a drawing showing an example of the configuration of the buffer 44. The buffer 44 shown in FIG. 2 includes NMOS transistors 51 through 54 and PMOS transistors 55 through 59. An inverter comprised of the NMOS transistor 51 and the PMOS transistor 58 is cross-coupled to an inverter comprised of the NMOS transistor 52 and the PMOS transistor 59, thereby forming a latch circuit for amplifying a voltage difference appearing between nodes C and /C in response to data stored in the NV cell 48.

Turning back to FIG. 2, the NMOS transistors 35 and 36 serving as nonvolatile memory cell transistors have the same structure as the other NMOS transistors such as the NMOS transistors 31 through 34 and 37 through 41 as well as NMOS transistors used in the SRAM cell 43 and the buffer 44. Here, MOS transistors with high breakdown voltage (e.g., 3.3-V MOS) are used as the MOS transistors 37 and 42. Further, it is preferable to manufacture all the MOS transistors of the memory cell unit with the same thickness of the gate oxide film. Namely, all the MOS transistors used in the circuit shown in FIG. 2 may be designed to operate with the same operating voltage (e.g., 1.8 V).

As shown in FIG. 2, the SRAM data lines SLN and SLT, which extend from the sense-amplifier-&-write-amplifier unit 24, are coupled to the SRAM cell 43 via the NMOS transistors 31 and 32 serving as a data transfer unit. An SRAM word line SWL, which extends from the X driver 28, is connected to the gates of the NMOS transistors 31 and 32. An NV word line NWL, which extends from the X driver 28, is coupled to the gate nodes of the NMOS transistors 35 and 36 serving as the nonvolatile memory cell.

Further, a cell precharge line PCNB and buffer enable line SNE extend from the X driver 28, and are connected to the buffer 44. Specifically, as shown in FIG. 3, the cell precharge line PCNB is coupled to the gates of the PMOS transistors 55 through 57 for the purpose of precharging and equalizing the node C and /C. The buffer enable line SNE is coupled to the gates of the NMOS transistors 53 and 54 so as to control the on/off state of the buffer 44.

Turning back to FIG. 2, a store plate voltage enable line SPLEB extends from the X driver 28, and is coupled to the gate of the NMOS transistor 37 and to the gate of the PMOS transistor 42. In response to the LOW state of the store plate voltage enable line SPLEB, a high voltage VPP is applied to the NV cell 48, so that the data stored in the SRAM cell 43 is stored in the NV cell 48. This is done by creating a hot-carrier-effect-based change in transistor characteristics with respect to either the NMOS transistor 35 or the NMOS transistor 36, whichever is selected by the data stored in the SRAM cell 43. Namely, one of the NMOS transistors 35 and 36 whose source node is set at the LOW level will experience a hot-carrier effect while the other one does not experience a hot-carrier effect. During the store operation to store the data of the SRAM cell 43 in the NV cell 48, a store enable signal STR is set to HIGH to make the NMOS transistors 33 and 34 conductive.

In response to the HIGH state of the store plate voltage enable line SPLEB, the data stored in the NV cell 48 is recalled, i.e., the data stored in the NV cell 48 is transferred to the buffer 44. For this purpose, a recall enable signal REC is set to HIGH during the recall operation. In this recall operation, the latch circuit included in the buffer 44 serves as a sense circuit to sense the data stored in the NV cell 48.

In the store operation to store data in the NV cell 48 according to the present invention, stored data is automatically verified and the writing of data to the NV cell 48 is automatically repeated until the stored data becomes the same as the data of the SRAM cell 43. To be specific, the data of the SRAM cell 43 is stored in the NV cell 48, and, then, the data stored in the NV cell 48 is recalled and stored in the buffer 44, followed by checking whether the data of the SRAM cell 43 is the same as the data stored in the buffer 44. Such store operation, recall operation, and verify operation are performed under the control of the timing controller 26.

If the data to be stored and the recalled data are the same, a store end signal STREND is set to HIGH. If the data to be stored and the recalled data are not the same, the store end signal STREND is set to LOW. The store end signal STREND is sent to the busy circuit 30 (see FIG. 1). While the store end signal STREND is LOW, the busy circuit 30 asserts a busy signal BSYB to a host device connected to the nonvolatile semiconductor memory device, thereby informing the host device that the data store operation is still underway.

The busy circuit 30 also informs the timing controller 26 that the store end signal STREND is LOW. While the store end signal STREND is LOW, the timing controller 26 performs a control operation that causes the store operation, recall operation, and verify operation to be repeated. When the store end signal STREND becomes HIGH, the busy circuit 30 negates the busy signal to inform the host device that the data store operation is completed. The busy circuit 30 also notifies the timing controller 26 of the HIGH state of the store end signal STREND. In response, the timing controller 26 stops the store operation, recall operation, and verify operation.

Figure 4:
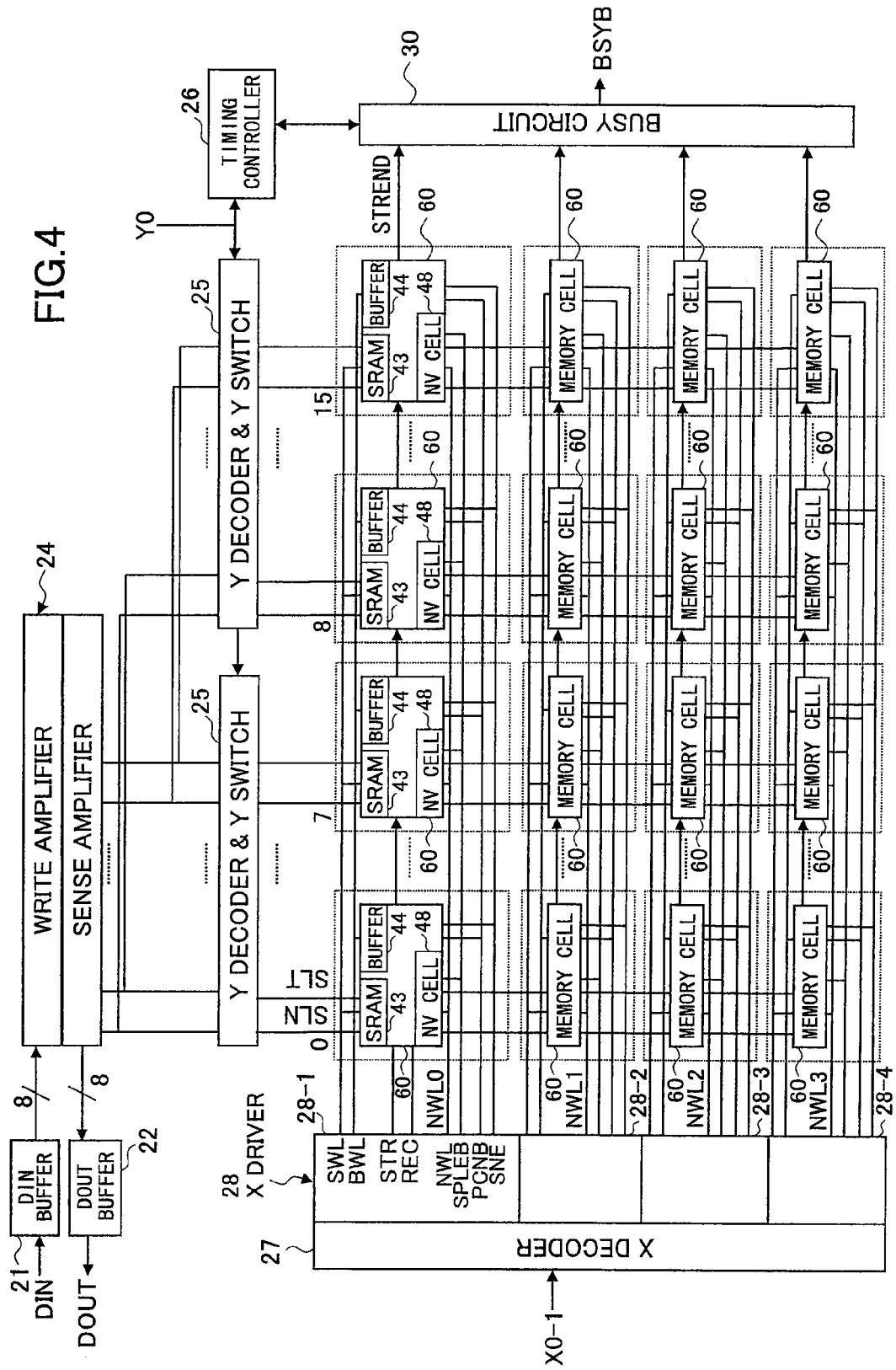
FIG. 4 is a drawing showing a more specific configuration of an X driver and a memory cell array shown in FIG. 1.

FIG. 4 is a drawing showing a more specific configuration of the X driver 28 and memory cell array 29 shown in FIG. 1. In FIG. 4, the same elements as those of FIG. 1 and FIG. 2 are referred to by the same numerals, and a description thereof will be omitted.

The X driver 28 includes X driver units 28-1 through 28-4 which are identical to one another in terms of circuit configuration. Each one of the X driver units 28-1 through 28-4 supplies a set of signals SWL, BWL, STR, REC, NWL, SPLEB, PCNB, and SNE. In FIG. 4, for the sake of simplicity of illustration, such a set of signals is illustrated with respect to only a representative one of the X driver units 28-1 through 28-4 shown at the top.

An address signal X0-1 supplied to the X decoder 27 may be comprised of 2 bits, for example, to select one of the X driver units 28-1 through 28-4, the number of which is 4 in this example. The memory cell array 29 shown in FIG. 1 corresponds to a plurality of memory cell units 60, the SRAM data lines SLN and SLT extending from the sense-amplifier-&-write-amplifier unit 24 (via the Y-decoder-&-Y-switch unit 25), and signal lines extending from the X driver units 28-1 through 28-4. Each of the memory cell units 60 has the configuration as shown in FIG. 2, and includes the SRAM cell 43, the buffer 44, and the NV cell 48, which are illustrated in FIG. 4 with respect to some representative ones of the memory cell units 60.

One of the X driver units 28-1 through 28-4 selected by the X decoder 27 activates the SRAM word line SWL to write data to the SRAM cells 43 with respect to the memory cell units 60 that are connected to the activated SRAM word line SWL. Further, one of the X driver units 28-1 through 28-4 selected by the X decoder 27 activates the buffer word line BWL to read data from the buffers 44 with respect to the memory cell units 60 that are connected to the activated buffer word line BWL. Data transfer between the sense-amplifier-&-write-amplifier unit 24 and either one of the SRAM cell 43 and the buffer 44 is conducted via the SRAM data lines SLN and SLT.

Figure 5:
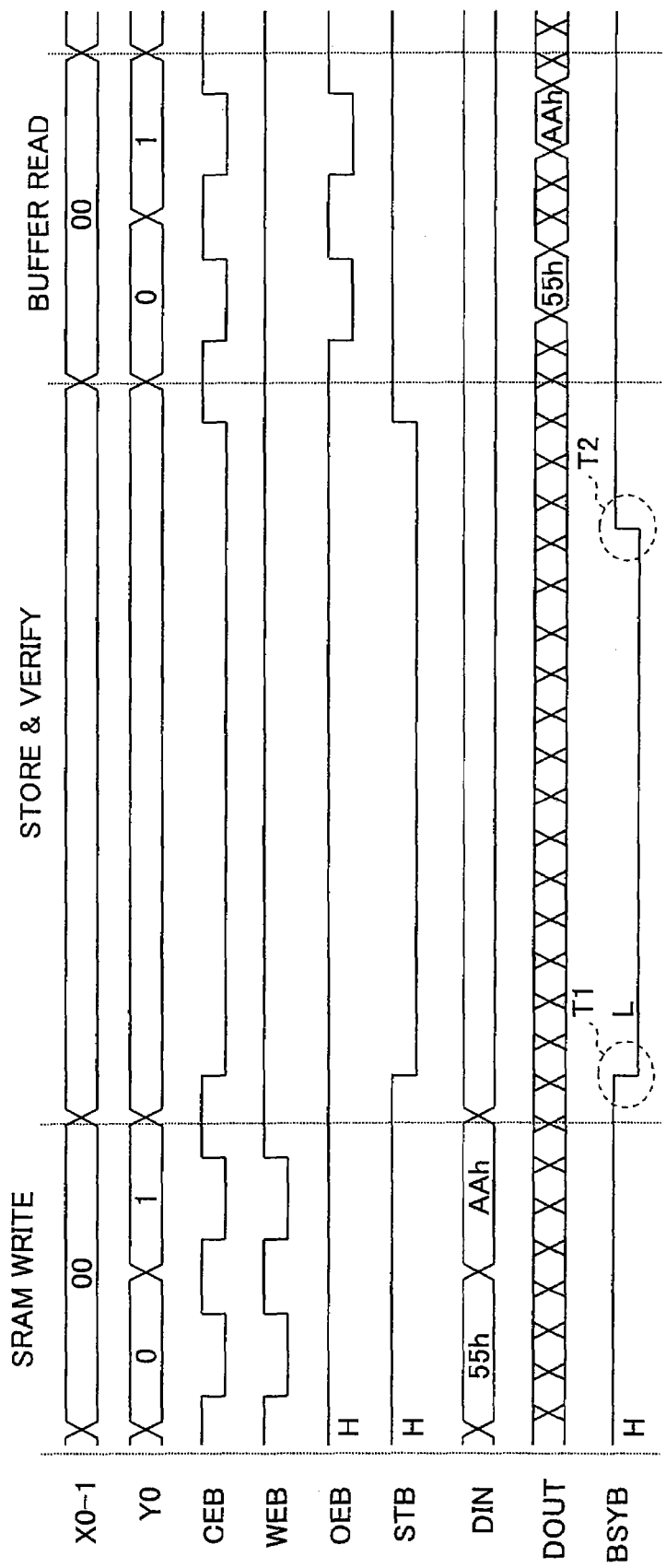
FIG. 5 is a timing chart for explaining operations of the nonvolatile semiconductor memory device of the present invention.

FIG. 5 is a timing chart for explaining operations of the nonvolatile semiconductor memory device of the present invention. The signals shown in FIG. 5 are those exchanged with the host device connected to the nonvolatile semiconductor memory device. That is, FIG. 5 shows the operation of the nonvolatile semiconductor memory device as viewed from the host device.

The first operation shown in FIG. 5 is an SRAM write operation that writes data to specified SRAM cells 43. The store enable signal STB and the output enable signal OEB are kept at HIGH, and the write enable signal WEB and the chip enable signal CEB are set to LOW to specify write timing. In this example, while the X address X0-1 is constantly set to "00", a Y address Y0 is set to "0" during the first write timing, and is set to "1" during the second write timing. Input data DIN is "55h" during the first write timing, and is "AAh" during the second write timing.

Referring to FIG. 4, the X address X0-1 is supplied to the X decoder 27, and the Y address Y0 is supplied to the Y-decoder-&-Y-switch unit 25. The input data DIN is supplied to the Din buffer 21. In response to the X address X0-1 being "00", the X driver unit 28-1 is selected by the X decoder 27 to activate the SRAM word line SWL extending from the X driver unit 28-1. In response to the Y address Y0 being "0", the Y-decoder-&-Y-switch unit 25 couples the sense-amplifier-&-write-amplifier unit 24 to the memory cell units 60 corresponding to data bits 0 through 7 shown in FIG. 4. Namely, the left-hand-side half of the Y-decoder-&-Y-switch unit 25 shown in FIG. 4 provides conductive signal paths between the sense-amplifier-&-write-amplifier unit 24 and the memory cell units 60 while the right-hand-side half of the Y-decoder-&-Y-switch unit 25 shown in FIG. 4 provides no conductive signal paths. The activation of the SRAM word line SWL to HIGH causes the input data "55h" to be written to the SRAM cells 43 of the memory cell units 60 corresponding to the data bits 0 through 7 shown in FIG. 4.

In response to the Y address Y0 being "1", the Y-decoder-&-Y-switch unit 25 couples the sense-amplifier-&-write-amplifier unit 24 to the memory cell units 60 corresponding to data bits 8 through 15 shown in FIG. 4. Namely, the right-hand-side half of the Y-decoder-&-Y-switch unit 25 shown in FIG. 4 provides conductive signal paths between the sense-amplifier-&-write-amplifier unit 24 and the memory cell units 60 while the left-hand-side half of the Y-decoder-&-Y-switch unit 25 shown in FIG. 4 provides no conductive signal paths. The activation of the SRAM word line SWL to HIGH causes the input data "AAh" to be written to the SRAM cells 43 of the memory cell units 60 corresponding to the data bits 8 through 15 shown in FIG. 4.

The second operation shown in FIG. 5 is a store-&-verify operation that stores the data of the SRAM cells 43 in the NV cells 48 and verifies the correctness of the stored data. The store enable signal STB and the chip enable signal CEB are set to LOW while the output enable signal OEB and the write enable signal WEB are set to HIGH. These signal settings are all that needs to be done from the host device. When the store operation starts in response to the LOW setting of the store enable signal STB, the nonvolatile semiconductor memory device sets the busy signal BSYB to LOW to assert the busy state at timing T1. The host device simply waits until the nonvolatile semiconductor memory device sets the busy signal BSYB to HIGH to negate the busy state at timing T2. Upon detecting the positive transition of the busy signal BSYB, the host device brings the store-&-verify operation to an end.

The third operation shown in FIG. 5 is a buffer read operation through which the host device reads data from the buffers 44. The store enable signal STB and the write enable signal WEB are kept at HIGH, and the output enable signal OEB and the chip enable signal CEB are set to LOW to specify data output timing. In this example, while the X address X0-1 is constantly set to "00", the Y address Y0 is set to "0" during the first output timing, and is set to "1" during the second output timing.

Referring to FIG. 4, the X address X0-1 is supplied to the X decoder 27, and the Y address Y0 is supplied to the Y-decoder-&-Y-switch unit 25. In response to the X address X0-1 being "00", the X driver unit 28-1 is selected by the X decoder 27 to activate the buffer word line BWL extending from the X driver unit 28-1. In response to the Y address Y0 being "0", the Y-decoder-&-Y-switch unit 25 couples the sense-amplifier-&-write-amplifier unit 24 to the memory cell units 60 corresponding to data bits 0 through 7 shown in FIG. 4. Namely, the left-hand-side half of the Y-decoder-&-Y-switch unit 25 shown in FIG. 4 provides conductive signal paths between the sense-amplifier-&-write-amplifier unit 24 and the memory cell units 60 while the right-hand-side half of the Y-decoder-&-Y-switch unit 25 shown in FIG. 4 provides no conductive signal paths. The activation of the buffer word line BWL to HIGH causes the data of the buffers 44 to be read from the memory cell units 60 corresponding to the data bits 0 through 7 shown in FIG. 4. As a result, the output data DOUT output from the Dout buffer 22 is set to "55h" during the first output timing.

In response to the Y address Y0 being "1", the Y-decoder-&-Y-switch unit 25 couples the sense-amplifier-&-write-amplifier unit 24 to the memory cell units 60 corresponding to data bits 8 through 15 shown in FIG. 4. Namely, the right-hand-side half of the Y-decoder-&-Y-switch unit 25 shown in FIG. 4 provides conductive signal paths between the sense-amplifier-&-write-amplifier unit 24 and the memory cell units 60 while the left-hand-side half of the Y-decoder-&-Y-switch unit 25 shown in FIG. 4 provides no conductive signal paths. The activation of the buffer word line BWL to HIGH causes the data of the buffers 44 to be read from the memory cell units 60 corresponding to the data bits 8 through 15 shown in FIG. 4. As a result, the output data DOUT output from the Dout buffer 22 is set to "AAh" during the second output timing.

Figure 6:
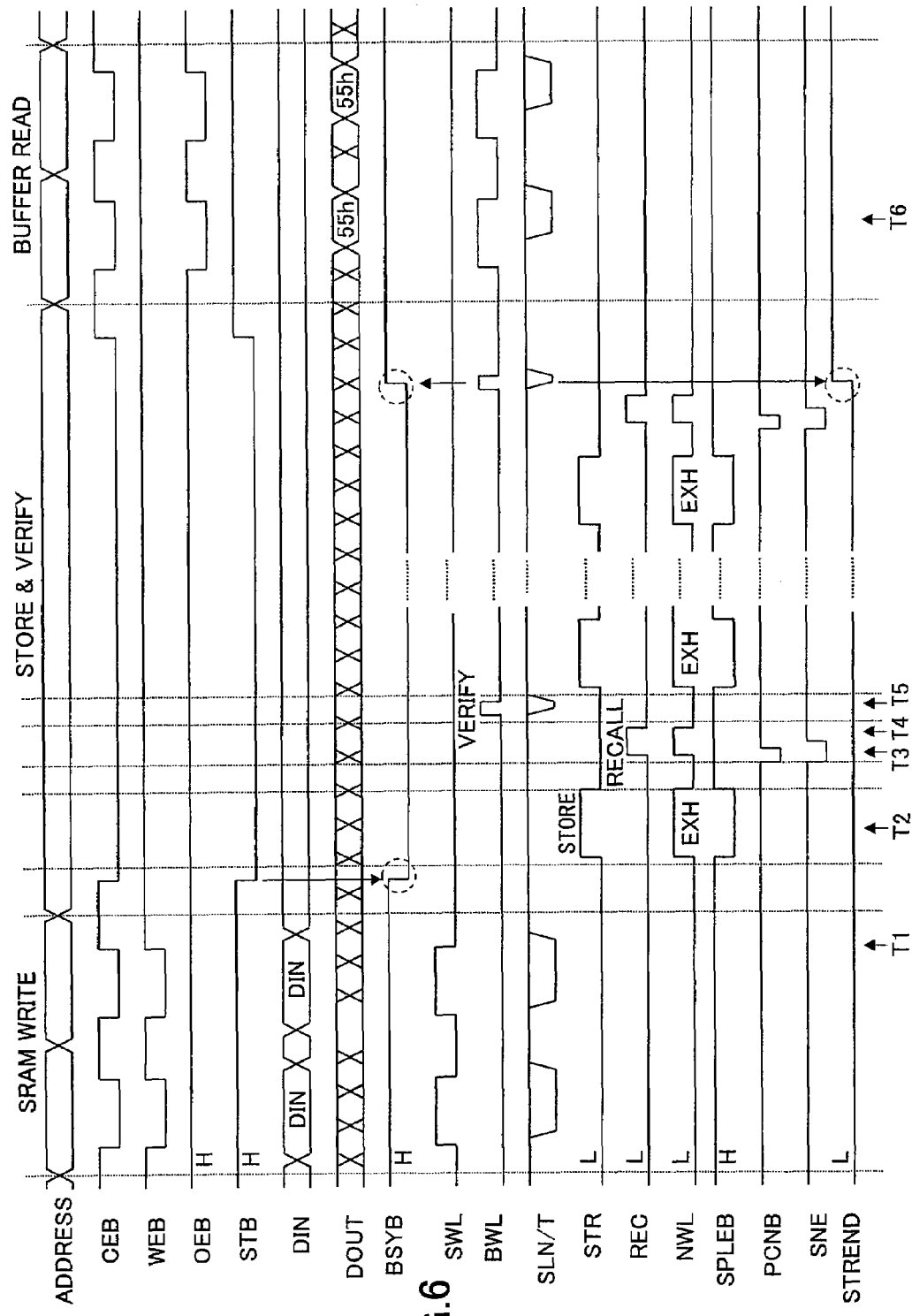
FIG. 6 is a timing chart for explaining the internal operations of the nonvolatile semiconductor memory device of the present invention.

FIG. 6 is a timing chart for explaining the internal operations of the nonvolatile semiconductor memory device of the present invention. FIG. 6 illustrates signals indicative of the internal operations of the memory device in addition to those exchanged with the host device connected to the nonvolatile semiconductor memory device. In the following, the internal operation of the nonvolatile semiconductor memory device will be described by referring to FIG. 6.

Figure 7:
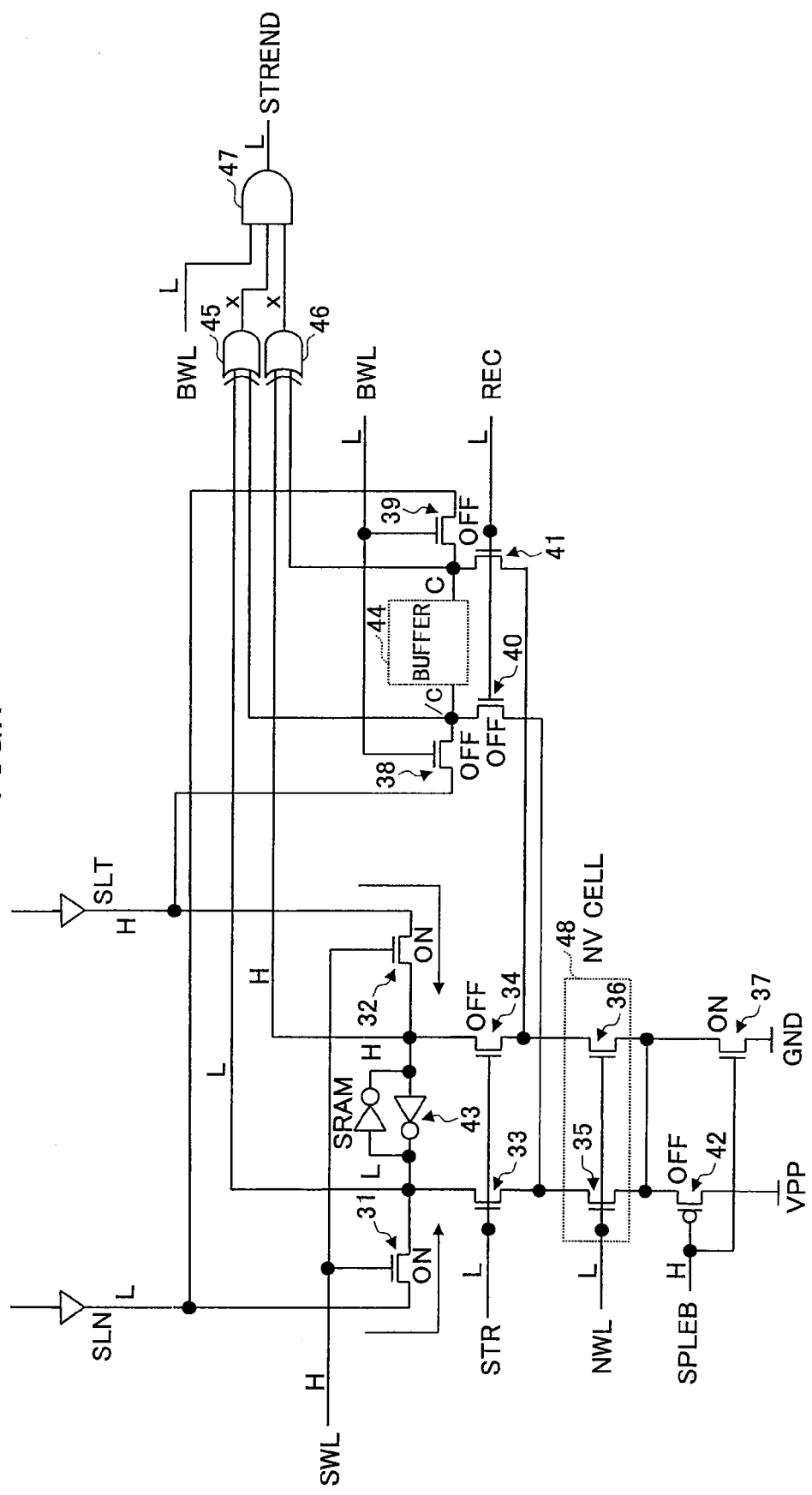
FIG. 7 is a drawing showing the relevant signal levels of a memory cell unit during an SRAM write operation.

The first operation shown in FIG. 6 is the SRAM write operation. FIG. 7 is a drawing showing the relevant signal levels of a memory cell unit during the SRAM write operation. The signal levels shown in FIG. 7 are observed at timing T1 shown in FIG. 6. As shown in FIG. 7, the NMOS transistors 31 and 32 are made conductive in response to the HIGH state of the SRAM word line SWL. As a result, data supplied through the SRAM data lines SLN and SLT is stored in the SRAM cell 43. During this SRAM write operation, the store enable signal STR and the buffer word line BWL are LOW so that the SRAM data lines SLN and SLT are electrically coupled only to the SRAM cell 43.

Figure 8:
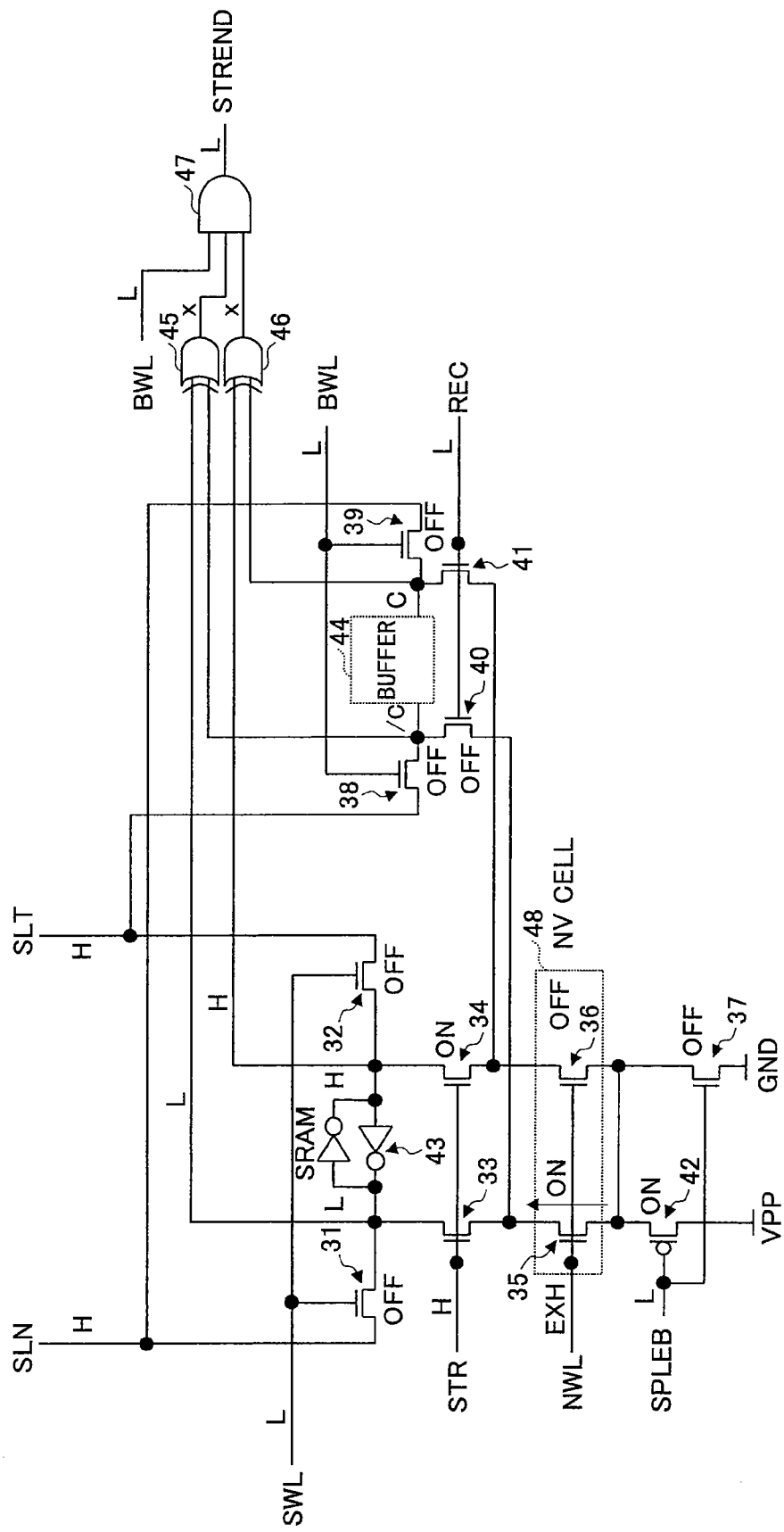
FIG. 8 is a drawing showing the relevant signal levels of a memory cell unit during a store operation.

The second operation shown in FIG. 6 is the store-&-verify operation. At timing T2 in FIG. 6, the store enable signal STR is set to HIGH to perform a first store operation. FIG. 8 is a drawing showing the relevant signal levels of a memory cell unit during a store operation. As shown in FIG. 8, the store enable signal STR is set to HIGH to make the NMOS transistors 33 and 34 conductive, thereby electrically coupling the SRAM cell 43 to the NV cell 48. At the same time, the store plate voltage enable line SPLEB is set to LOW to make the PMOS transistor 42 conductive, thereby applying the high voltage VPP (e.g., 3.3 V) to the NV cell 48. The NV word line NWL is set to EXH (e.g., 1.65 V), which is determined such as to maximize the effect of a hot-carrier phenomenon. Generally, such potential is selected to be half the voltage between the source node and drain node of the transistor that is subjected to a hot-carrier effect.

With the signal level settings as described above, a voltage of 3.3 V between VPP and the LOW level (i.e., 0 V) is applied between the drain node and source node of one of the NMOS transistors 35 and 36, whichever is selected according to the data stored in the SRAM cell 43. In the example shown in FIG. 8, the selected one of the NMOS transistors is the NMOS transistor 35. Further, a voltage of 1.65 V between the NV word line potential and the LOW level is applied between the gate node and source node of this NMOS transistor 35. Since these bias voltages are larger than the voltages used in routine operations, the NMOS transistor 35 experiences a strong hot-carrier effect. In the example shown in FIG. 8, only the NMOS transistor 35 experiences a hot-carrier effect while the NMOS transistor 36 does not experience a hot-carrier effect.

Figure 9:
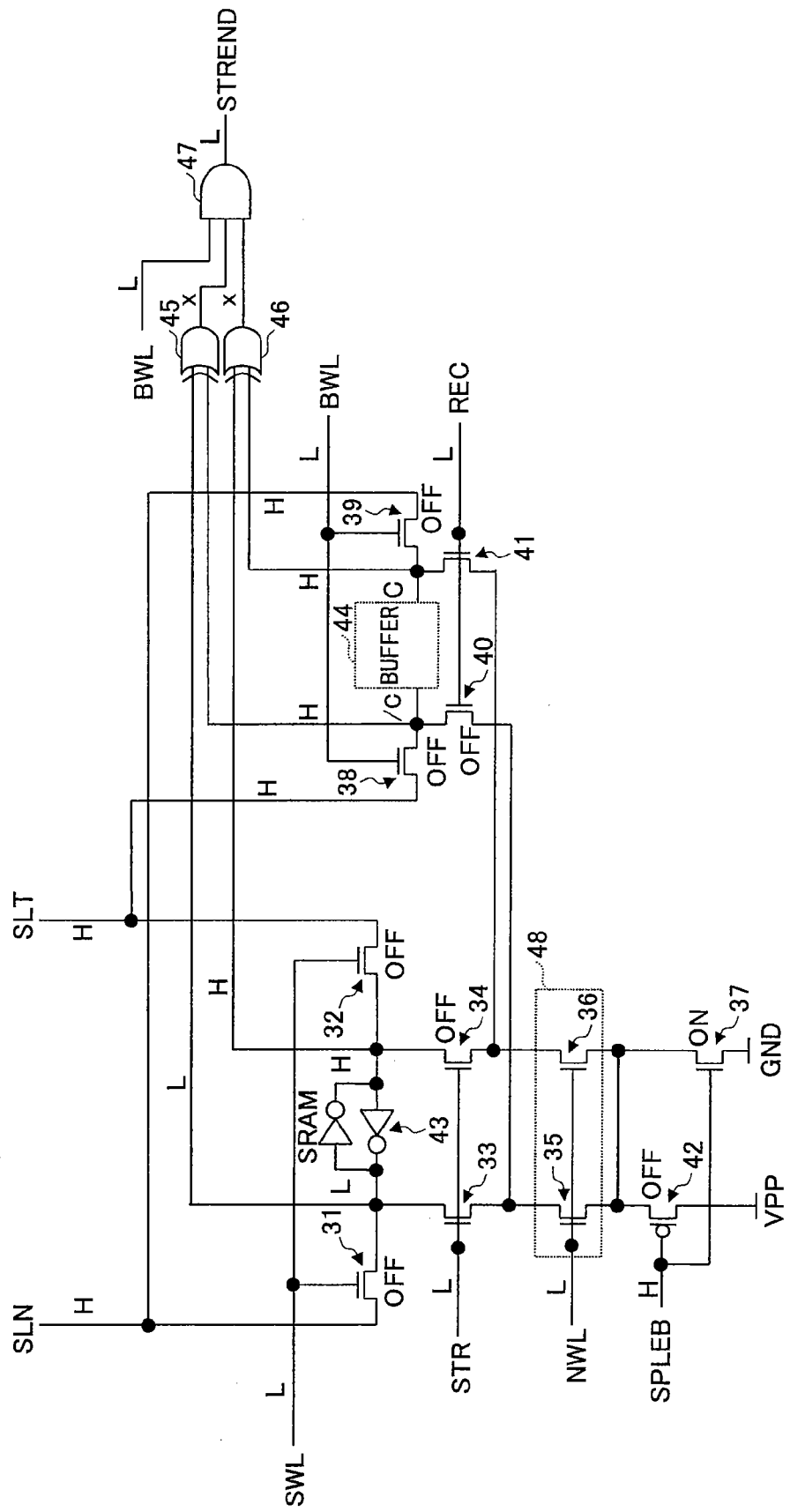
FIG. 9 is a drawing showing the relevant signal levels of a memory cell unit during a precharge operation.

At timing T3 in FIG. 6, the cell precharge signal PCNB and buffer enable signal SNE are set to LOW. As is understood from the configuration shown in FIG. 3, such signal settings serve to precharge the nodes C and /C of the buffer 44 to HIGH (i.e., VDD). FIG. 9 is a drawing showing the relevant signal levels of a memory cell unit during the precharge operation. As shown in FIG. 9, the two nodes C and /C of the buffer 44 are both set to HIGH.

Figure 10:
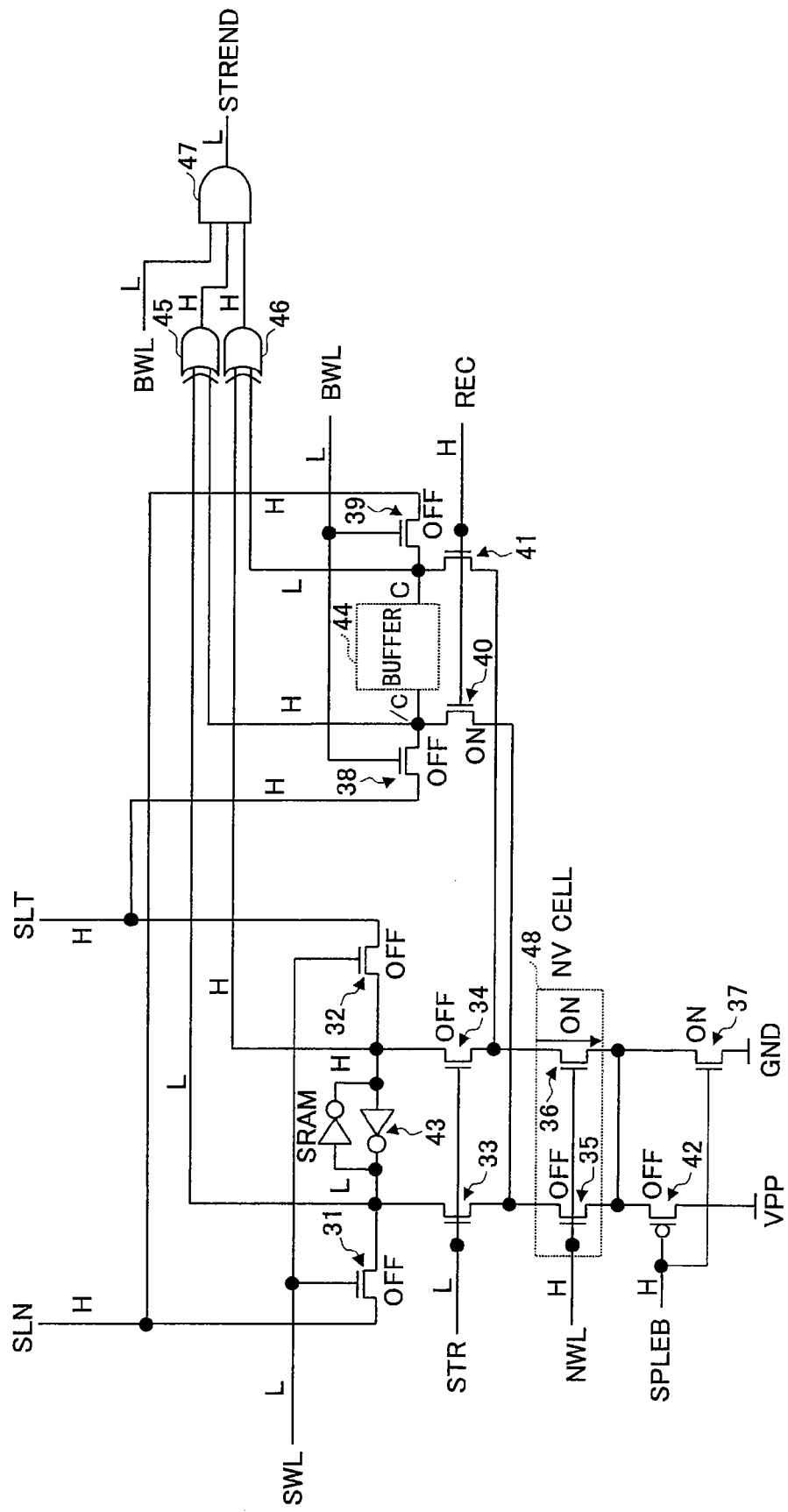
FIG. 10 is a drawing showing the relevant signal levels of a memory cell unit during a recall operation.

At timing T4 in FIG. 6, the recall enable signal REC and the NV word line are set to HIGH to perform a recall operation. FIG. 10 is a drawing showing the relevant signal levels of a memory cell unit during the recall operation. As shown in FIG. 10, the recall enable signal REC is set to HIGH to make the NMOS transistors 40 and 41 conductive, thereby electrically coupling the buffer 44 to the NV cell 48. With the store plate voltage enable line SPLEB set to HIGH, further, the NV word line NWL is set to HIGH to activate the NMOS transistors 35 and 36 of the NV cell 48.

In order to recall the data from the NV cell 48, the buffer 44 is initially placed in an electrically inactive state, and is then shifted to an electrically active state. This is achieved by changing both the cell precharge signal PCNB and the buffer enable signal SNE (see FIG. 3) from LOW to HIGH. Prior to the activation of the buffer 44, the NV word line NWL is set to HIGH (e.g., 1.8V) as shown in FIG. 6.

In the example shown in FIG. 10, the NMOS transistor 35 has a lingering change in the characteristics due to a hot-carrier effect whereas the NMOS transistor 36 does not have such a lingering change in the characteristics. The force that pulls down the electrical node /C is thus weaker than the force that pulls down the electrical node C. After the activation of the buffer 44, therefore, the electrical node /C is set to the HIGH level, and the electrical node C is set to the LOW level.

Figure 11:
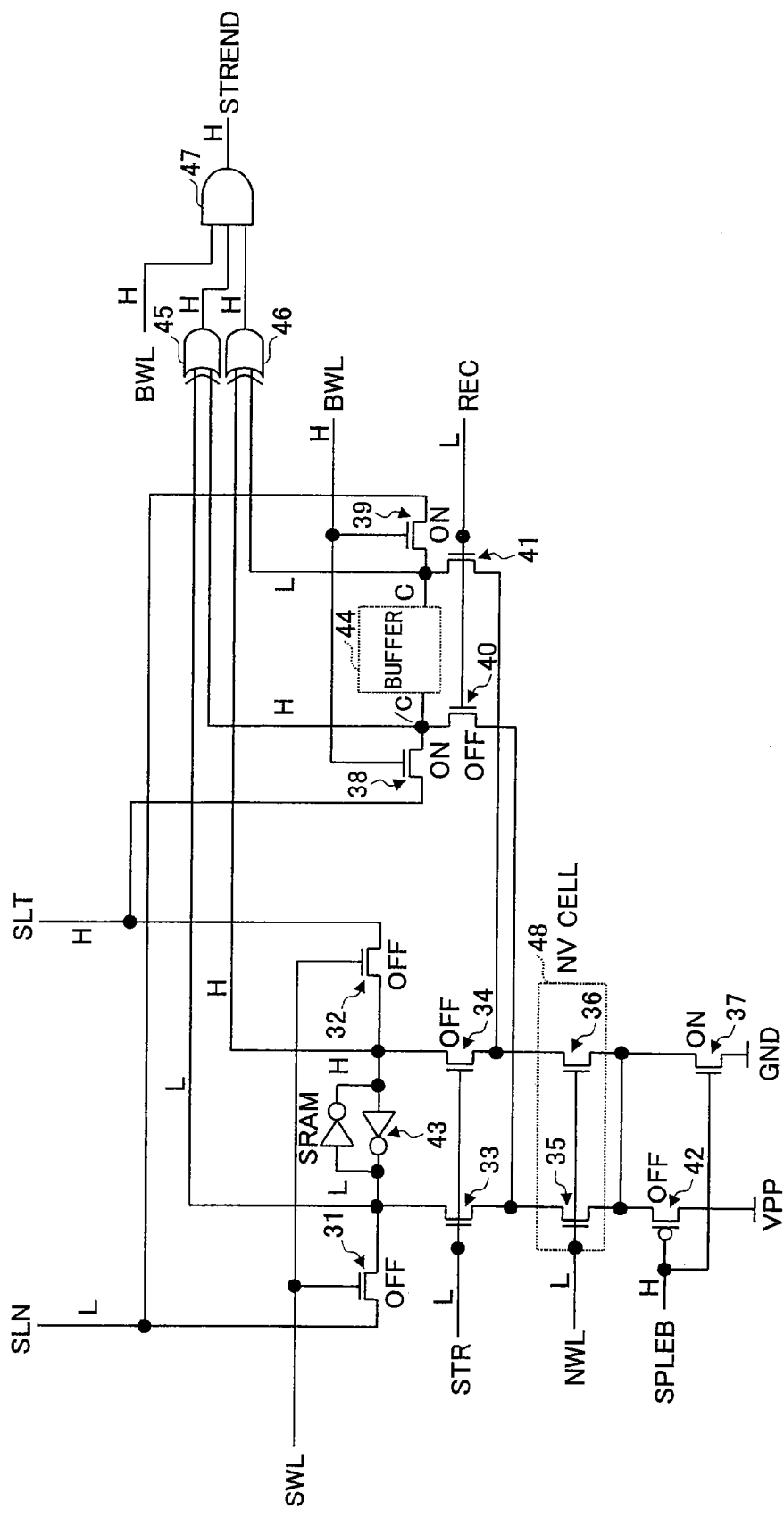
FIG. 11 is a drawing showing the relevant signal levels of a memory cell unit during a verify operation.

At timing T5 in FIG. 6, the buffer word line BWL is set to HIGH to perform a verify operation. FIG. 11 is a drawing showing the relevant signal levels of a memory cell unit during the verify operation. As shown in FIG. 11, the buffer word line BWL is set to HIGH, so that a comparison circuit comprised of the XOR gates 45 and 46 and the AND gate 47 produces the store end signal STREND indicative of the result of comparison between the data stored in the SRAM cell 43 and the data stored in the buffer 44. It should be noted that due to the nature of the store operation and recall operation, the data stored in the buffer 44 is inverse to the data stored in the SRAM cell 43. If the store operation is properly performed to securely store the data in the NV cell 48, thus, both of the XOR gates 45 and 46 produce HIGH outputs. In such case, the store end signal STREND becomes HIGH as shown in FIG. 11 to indicate the end of the store-&-verify operation.

After the first recall operation at timing T5 shown in FIG. 6, however, the data stored in the buffer 44 may not be correct data due to the lack of a sufficient change in transistor characteristics occurring in the NMOS transistor 35 of the NV cell 48. In such a case, the store end signal STREND stays at LOW as shown in FIG. 6. As previously described, a store operation, a recall operation, and a verify operation are repeatedly performed under the control of the timing controller 26 (see FIG. 1) until the store end signal STREND becomes HIGH.

Figure 12:
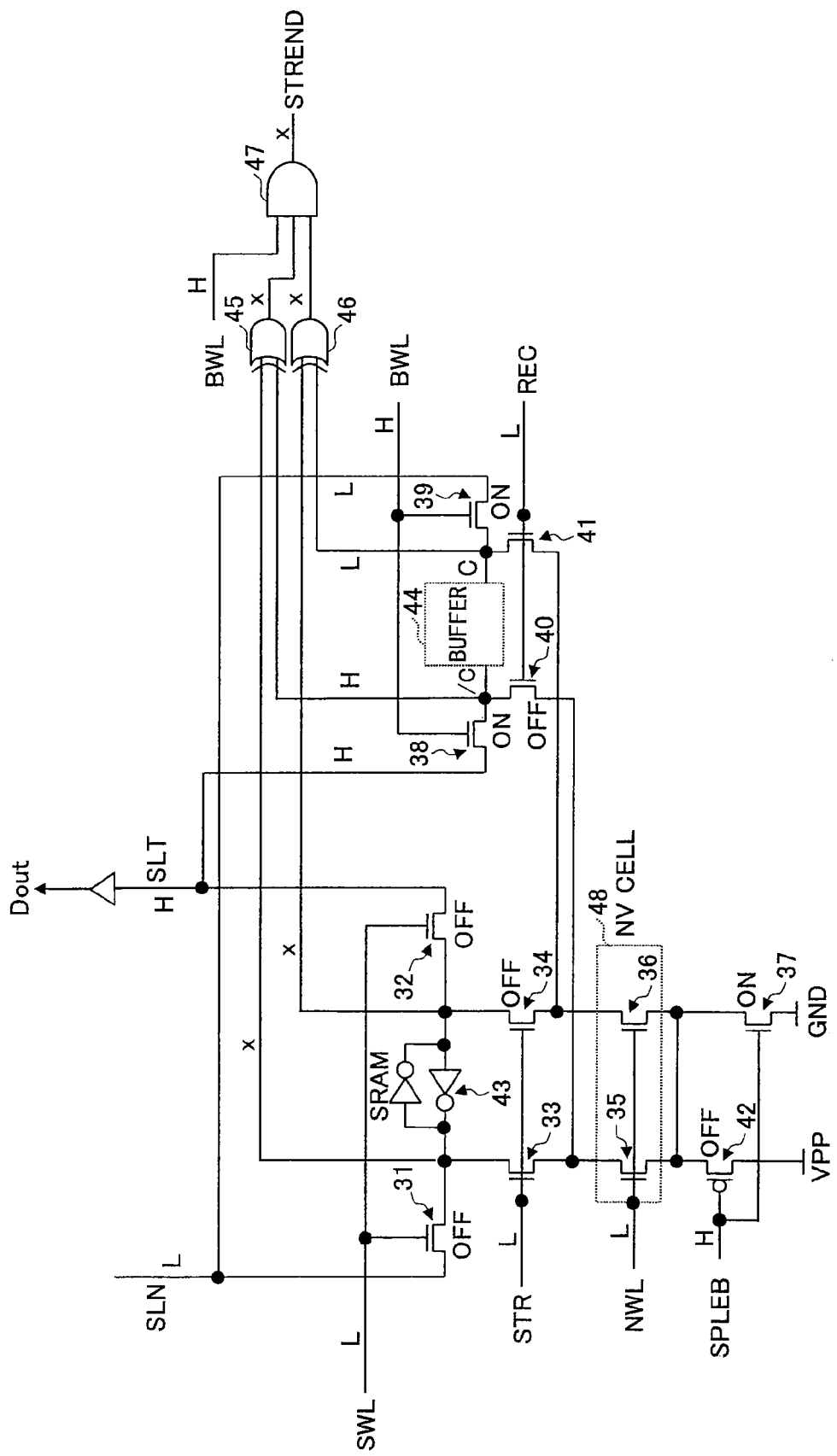
FIG. 12 is a drawing showing the relevant signal levels of a memory cell unit during a buffer read operation.

The third operation shown in FIG. 6 is the buffer read operation. FIG. 12 is a drawing showing the relevant signal levels of a memory cell unit during the buffer read operation. The signal levels shown in FIG. 12 are observed at timing T6 shown in FIG. 6. As shown in FIG. 12, the buffer word line BWL is set to HIGH to make the NMOS transistors 38 and 39 conductive, thereby electrically coupling the nodes C and /C of the buffer 44 to the SRAM data lines SLN and SLT, respectively. It should be noted that the nodes C and /C of the buffer 44 are connected to the SRAM data lines SLN and SLT, respectively, as opposed to the other way around, for the purpose of inverting the data stored in the buffer 44 upon reading the data to the SRAM data lines.

With the automatic store-&-verify operation as shown in FIG. 5 and FIG. 6 according to the present invention, all that needs to be done by the host device is to make signal settings indicative of the store-&-verify operation and to wait until the busy signal is negated. That is, the store-&-verify operation is performed as one host cycle. Specifically, the timing controller 26 starts the store operation, recall operation, and verify operation in response to a trigger (i.e., the above-noted signal settings) from the host device, and then continues repeating the store operation, recall operation, and verify operation on its own without a further input from the host device, followed by stopping the store operation, recall operation, and verify operation in response to the negation of the busy signal. Since the store-&-verify operation of the present invention performs store operations no more than necessary to store data in relevant NV cells, the time required for the store operation is optimized as opposed to the conventional store operation that is performed by guaranteeing a safety margin for the worst case.

Figure 13:
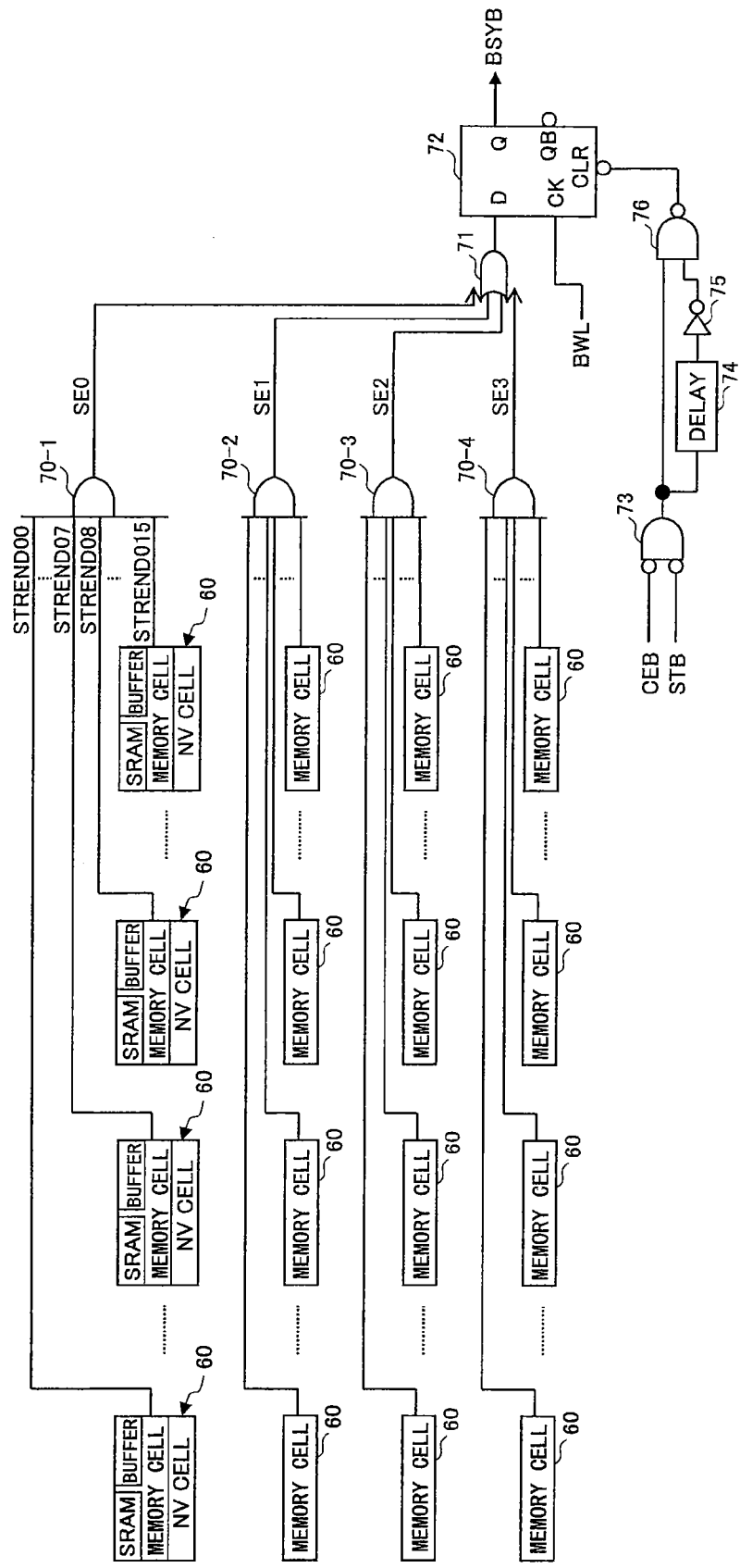
FIG. 13 is a drawing showing an example of a circuit configuration by which the store-&-verify operation of the present invention is performed on an X-address-specific basis.

The store-&-verify operation as described above may be performed on an X-address-specific basis or performed at once with respect to all the X addresses. FIG. 13 is a drawing showing an example of the circuit configuration by which the store-&-verify operation of the present invention is performed on an X-address-specific basis. In FIG. 13, the memory cell units 60 are arranged in four rows and sixteen columns. The circuit portion shown in FIG. 13 other than these memory cell units 60 may be provided in the busy circuit 30 (see FIG. 1 and FIG. 4). The 16 memory cell units 60 on the first row have the store end signals STREND00 through STREND015, respectively, which are input into an AND gate 70-1. By the same token, the stored end signals of the 16 memory cell units 60 on the second through fourth rows are input into AND gates 70-2 through 70-4, respectively.

Outputs SE0 through SE3 of the AND gates 70-1 through 70-4 are input into an OR gate 71, which has its output node coupled to a data input node D of a flip-flop 72. An output of the flip-flop 72 is the busy signal BSYB that is previously described. In the configuration shown in FIG. 13, an X address corresponding to one of the four rows is specified to perform a store-&-verify operation with respect to the specified row. When all the memory cell units 60 at the specified row produce HIGH store end signals, a corresponding one of the signals SE0 through SE3 is set to HIGH, resulting in the output of the OR gate 71 being changed to HIGH. Upon the activation of the buffer word line BWL, the flip-flop 72 latches the HIGH level (i.e., data "1") applied to the data input node D, thereby setting the busy signal BSYB to HIGH indicating the end of the store-&-verify operation.

An AND gate 73, a delay unit 74, an inverter 75, and a NAND gate 76 together constitute a one-shot-pulse generating circuit. In response to setting to LOW of both the chip enable signal CEB and the store enable signal STB, the output of the AND gate 73 becomes HIGH. In response, the output of the NAND gate 76 becomes LOW for a predetermined time period corresponding to the length of the delay of the delay unit 74. This LOW pulse resets the flip-flop 72 at the beginning of the store-&-verify operation, thereby setting the busy signal BSYB to LOW.

Figure 14:
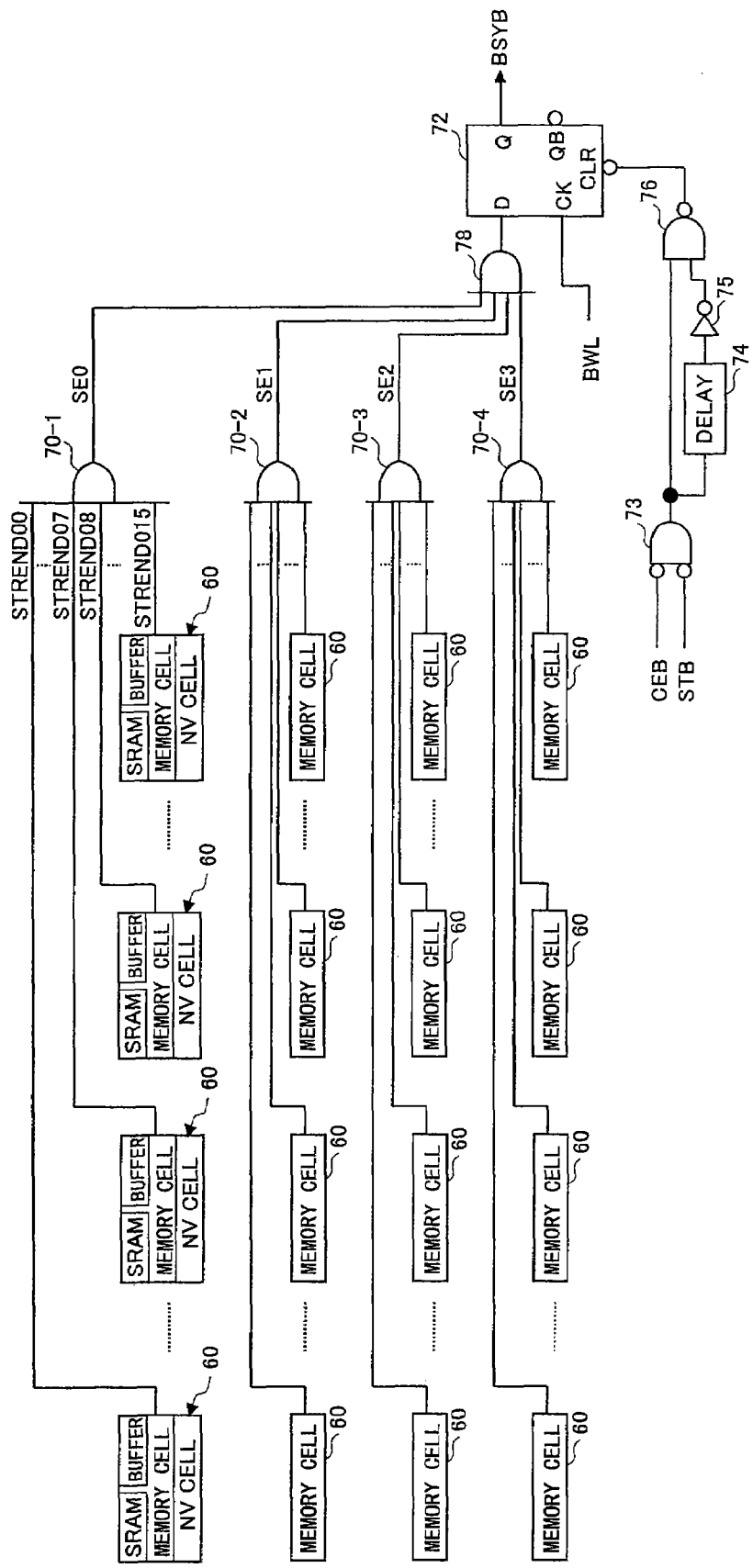
FIG. 14 is a drawing showing an example of a circuit configuration by which the store-&-verify operation of the present invention is performed at once with respect to all the X addresses.

FIG. 14 is a drawing showing an example of the circuit configuration by which the store-&-verify operation of the present invention is performed at once with respect to all the X addresses. In FIG. 14, the same elements as those shown in FIG. 13 are referred to by the same numerals, and a description thereof will be omitted.

The circuit shown in FIG. 14 differs from the circuit shown in FIG. 13 in that an AND gate 78 is provided in place of the OR gate 71. The memory cell units 60 are arranged in four rows and sixteen columns. The stored end signals of the 16 memory cell units 60 in the first through fourth rows are input into the AND gates 70-1 through 70-4, respectively.

The outputs SE0 through SE3 of the AND gates 70-1 through 70-4 are input into the AND gate 78, which has its output node coupled to the data input node D of the flip-flop 72. In the configuration shown in FIG. 14, a store-&-verify operation is performed at once with respect to all the X addresses, i.e., performed in a lump with respect to all the four rows. When all the memory cell units 60 of all the rows produce HIGH store end signals, the output of the AND gate 78 changes to HIGH. Upon the activation of the buffer word line BWL, thus, the flip-flop 72 latches the HIGH level (i.e., data "1") applied to the data input node D, thereby setting the busy signal BSYB to HIGH indicating the end of the store-&-verify operation.

Figure 15:
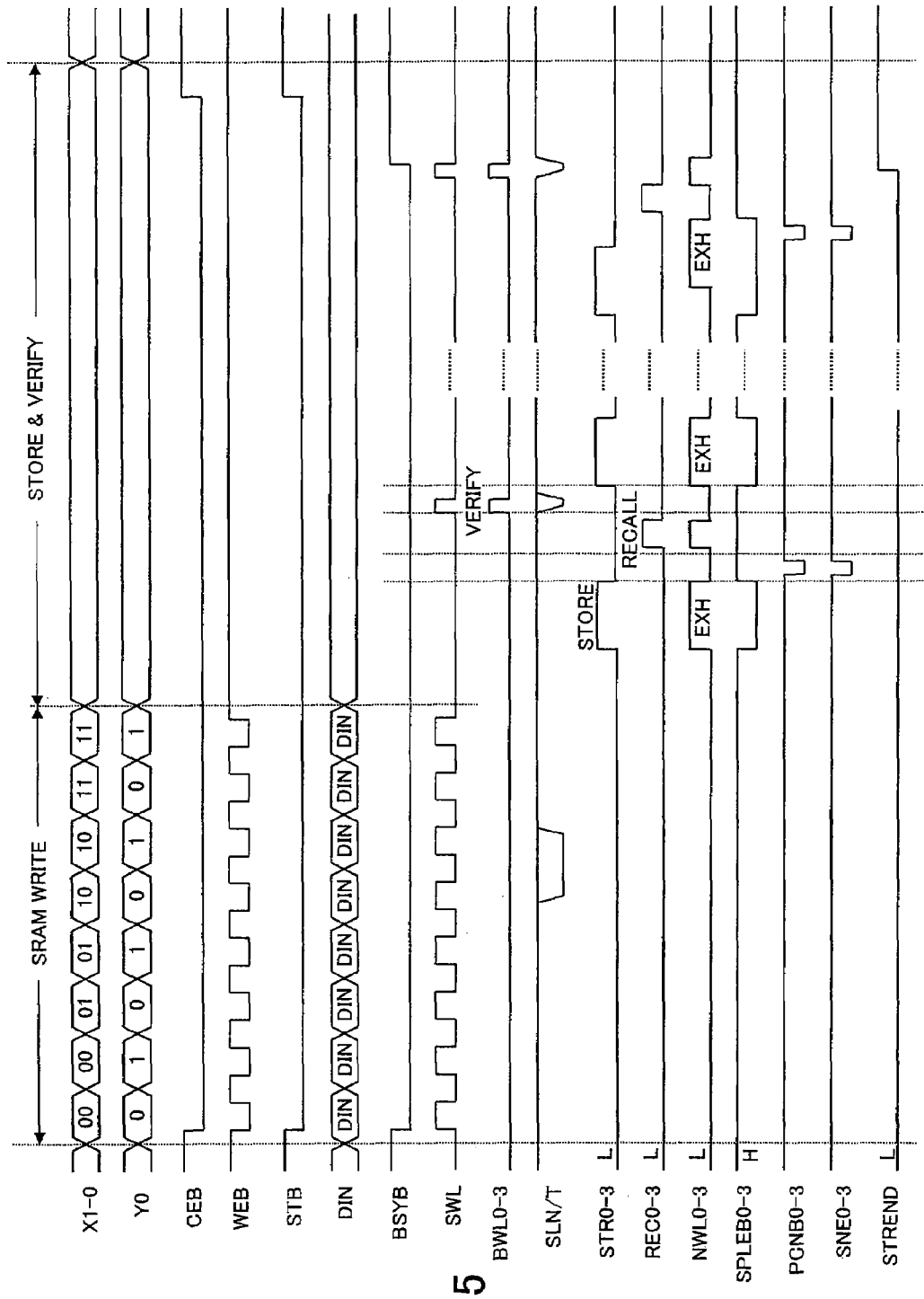
FIG. 15 is a timing chart for explaining the store-&-verify operation that is performed at once with respect to all X addresses.

FIG. 15 is a timing chart for explaining the store-&-verify operation that is performed at once with respect to all the X addresses. In FIG. 6, an SRAM write operation is performed with respect to a specified X address, and, then, a store-&-verify operation is performed with respect to the specified X address. In FIG. 15, on the other hand, an SRAM write operation is successively performed with respect to all the four X addresses "00", "01", "10", and "11", and, then, a store-&-verify operation is performed at once with respect to all the four X addresses. In FIG. 15, signals BWL0-3 correspond to the buffer word lines BWL for the first through fourth rows. Other notations such as STR0-3, REC0-3, and so on also refer to the respective relevant signals for the first through fourth rows. During the store-&-verify operation, the store enable signals STR0-3, the NV word lines NWL0-3, the store plate voltage enable lines SPLEB0-3, the cell precharge lines PCNB0-3, the buffer enable lines SNE0-3, the recall enable signals REC0-3, and the buffer word lines BWL0-3 are driven simultaneously with respect to all the four rows as shown in FIG. 15.

Figure 16:
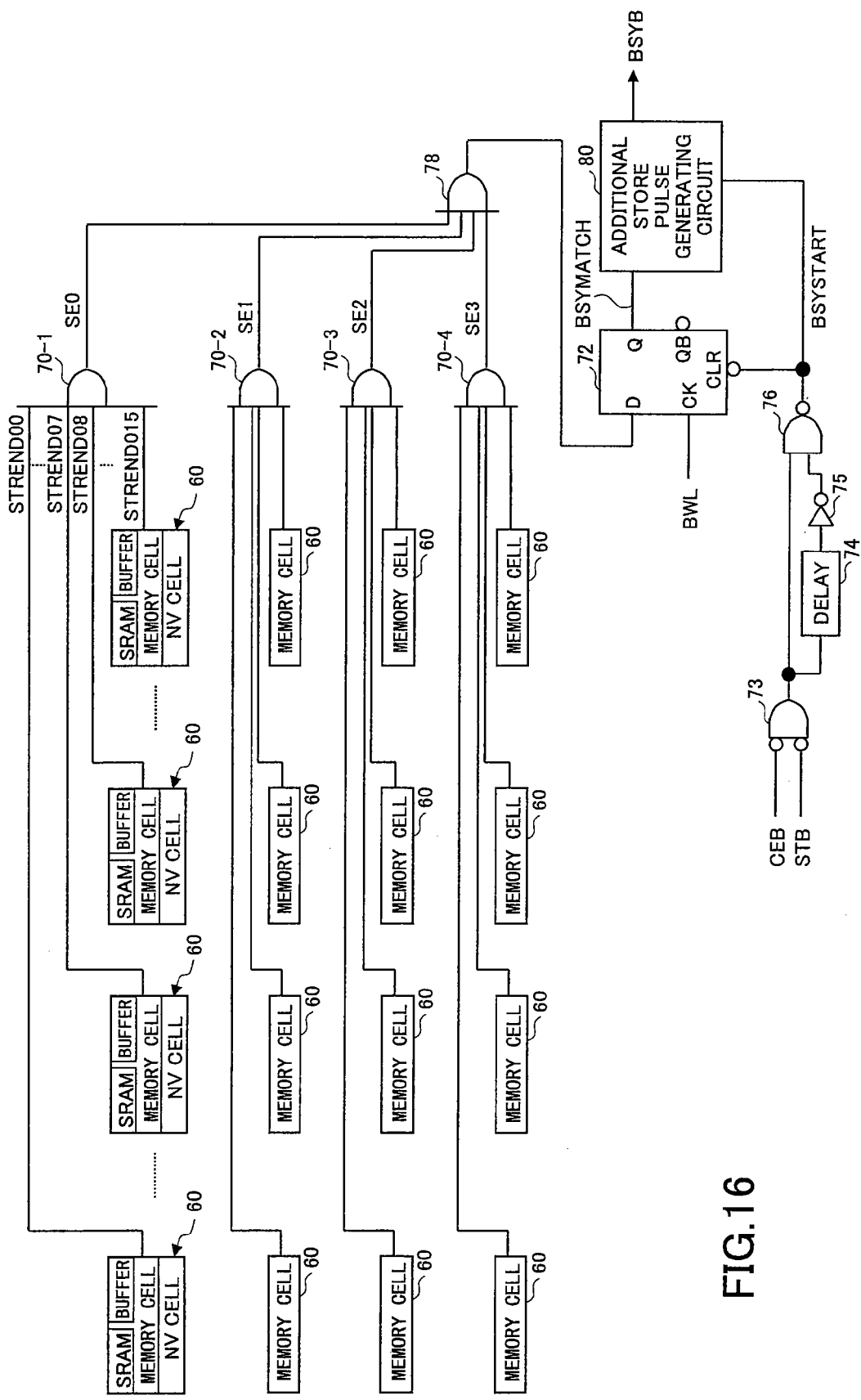
FIG. 16 is a drawing showing a variation of the circuit configuration shown in FIG. 14.

FIG. 16 is a drawing showing a variation of the circuit configuration shown in FIG. 14. In FIG. 16, the same elements as those of FIG. 14 are referred to by the same numerals, and a description thereof will be omitted.

The circuit shown in FIG. 16 differs from the circuit shown in FIG. 14 in that an additional store pulse generating circuit 80 is additionally provided. When all the memory cell units 60 of all the rows produce HIGH store end signals, the output of the AND gate 78 changes to HIGH. Upon the activation of the buffer word line BWL, thus, the flip-flop 72 latches the HIGH level (i.e., data "1") applied to the data input node D, thereby setting a match signal BSYMATCH to HIGH indicating the end of the store-&-verify operation.

Rather than using this match signal BSYMATCH as the busy signal BSYB thereby to bring the store-&-verify operation to an end immediately, the match signal BSYMATCH is used to trigger the additional store pulse generating circuit 80 to generate an additional store pulse, thereby performing an additional store operation for the purpose of making sure that correct data is stored in the NV cells.

Figure 17:
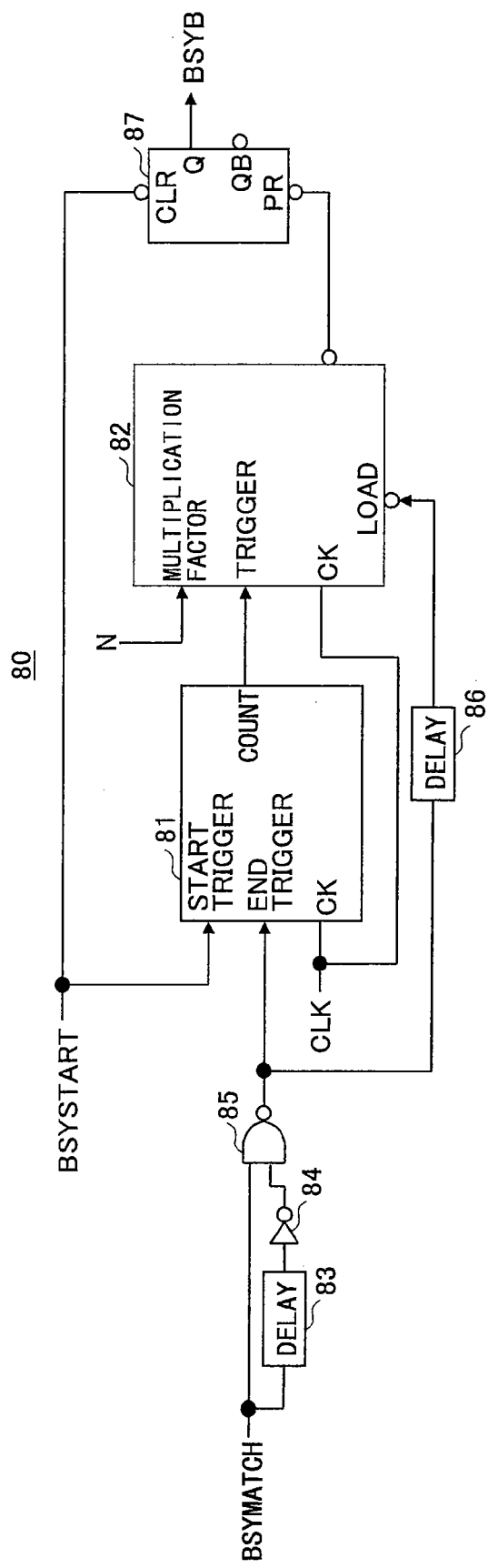
FIG. 17 is a drawing showing an example of the circuit configuration of an additional store pulse generating circuit shown in FIG. 16.

FIG. 17 is a drawing showing an example of the circuit configuration of the additional store pulse generating circuit 80 shown in FIG. 16. The additional store pulse generating circuit 80 includes a counter 81, a counter 82, a delay unit 83, an inverter 84, a NAND gate 85, a delay unit 86, a flip-flop 87. In response to a change to HIGH in the start signal BSYSTART, the counter 81 starts counting the pulses of a clock signal CLK. The circuit comprised of the delay unit 83, the inverter 84, and the NAND gate 85 produces a LOW pulse in response to a change to HIGH in the match signal BSYMATCH. This LOW pulse causes the counter 81 to stop its counting operation. The count output of the counter 81 is thus set to a count indicative of the time period that has passed from the start of the store-&-verify operation to the positive transition of the match signal BSYMATCH. After the passage of the delay time of the delay unit 86, the counter 82 loads the count output of the counter 82. The counter 82 multiplies the loaded count by "N" to obtain an initial count value, and decreases the count value one by one in synchronization with the clock signal CLK. When the count value becomes zero, the counter 82 sets the flip-flop 87 to change the busy signal BSYB to HIGH.

Figure 18:
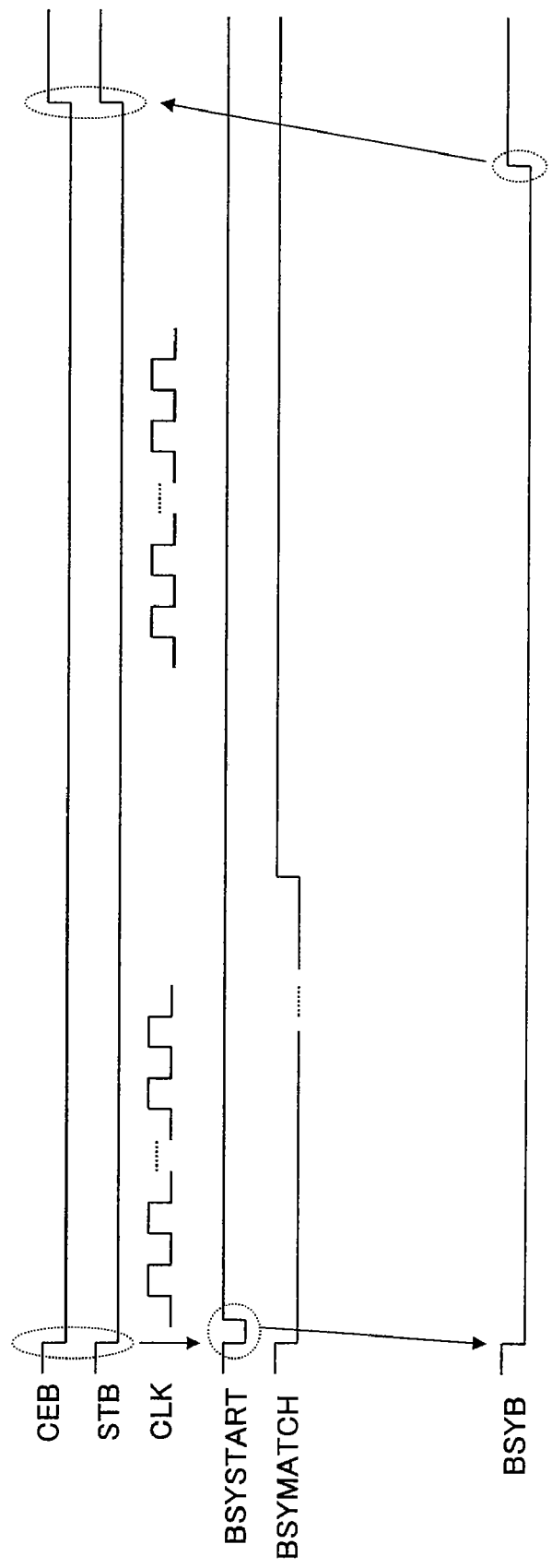
FIG. 18 is a timing chart showing the operation of the additional store pulse generating circuit shown in FIG. 17.

FIG. 18 is a timing chart showing the operation of the additional store pulse generating circuit 80. As shown in FIG. 18, the busy signal BSYB does not become HIGH immediately after the positive transition of the match signal BSYMATCH, but becomes HIGH upon the passage of some delay time following the positive transition of the match signal BSYMATCH. This delay time corresponds to N times the time period passing from the start of the store-&-verify operation to the positive transition of the match signal BSYMATCH. During the time period corresponding to this delay time, the timing controller 26 (see FIG. 1) continues its control operation that causes the store operation, recall operation, and verify operation to be repeated. With the multiplication factor N set to an appropriate value, arrangement can be made such that the timing controller 26 performs a single store operation before the busy signal BSYB becomes HIGH to notify the timing controller 26 of the end of the store-&-verify operation.

Figure 19:
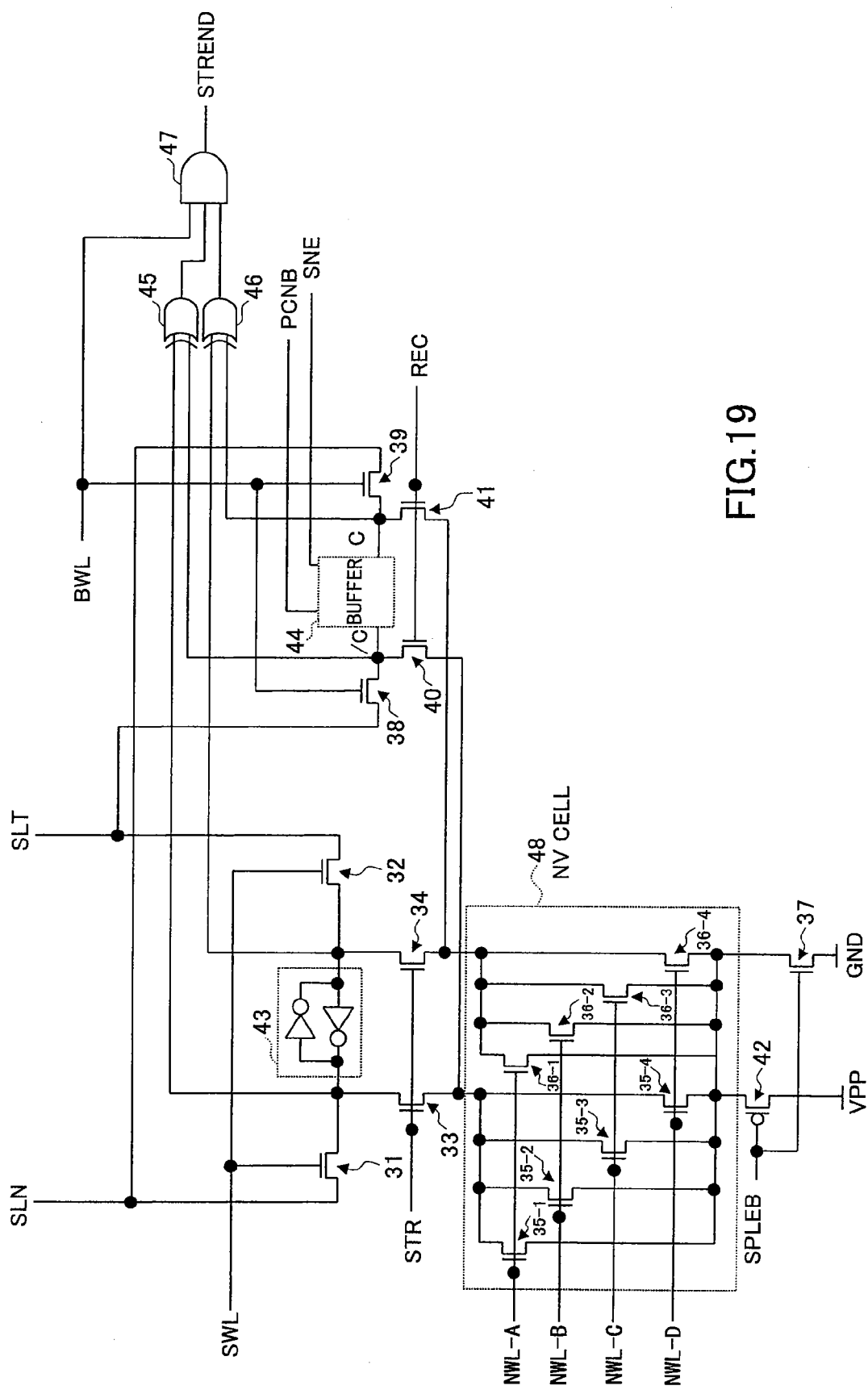
FIG. 19 is a drawing showing a variation of the memory cell unit according to the present invention.

FIG. 19 is a drawing showing a variation of the memory cell unit according to the present invention. In FIG. 19, the same elements as those of FIG. 2 are referred to by the same numerals, and a description thereof will be omitted. Since the injection of electrons into an oxide film is permanent, the writing of data to a pair of NMOS transistors may generally be performed only once. In the configuration shown in FIG. 19, provision is made such as to allow the writing of data to be performed more than once.

In the memory cell unit shown in FIG. 19, the NV cell 48 includes NMOS transistors 35-1 through 35-4 and NMOS transistors 36-1 through 36-4. Each of the NMOS transistors 35-1 through 35-4 is coupled to a corresponding one of NV word lines NWL-A through NWL-D, and is paired with a corresponding one of the NMOS transistors 36-1 through 36-4 that is coupled to the same NV word line. Any given pair of the NMOS transistors serves as a nonvolatile memory cell. The four pairs of NMOS transistors together constitute NV cell 48. Since there are four nonvolatile memory cells (i.e., four pairs of nonvolatile memory cell transistors) coupled to the four NV word lines NWL-A through NWL-D, the NV cell 48 shown in FIG. 19 can store nonvolatile data four times. The number of transistor pairs in the NV cell 48 is not limited to four, and may alternatively be any desired number that is two or more.

When the memory cell unit having the configuration shown in FIG. 19 is used in the configuration shown in FIG. 4, each and every single one of the NV cells 48 shown in FIG. 4 includes the four pairs of NMOS transistors as shown in FIG. 19. Also, each of the X driver units 28-1 through 28-4 drives four NV word lines NWL-A through NWL-D as shown in FIG. 19. That is, the NV word lines NWL-A through NWL-D as shown in FIG. 19 extend from each one of the X driver units 28-1 through 28-4. Which one of the X driver units 28-1 through 28-4 is active depends on the X address supplied to the nonvolatile semiconductor memory device. Which one of the NV word lines NWL-A through NWL-D is driven by the active one of the X driver units 28-1 through 28-4 depends on how many times data is stored in the relevant NV cells 48. When data is stored in a given NV cell 48 for the first time, the NV word line NWL-A may be activated to create a hot-carrier effect with respect to one of the NMOS transistors 35-1 and 36-1. In order to recall this data, the NV word line NWL-A is activated. When data is thereafter stored in this NV cell 48 the second time, for example, the NV word line NWL-B may be activated to create a hot-carrier effect with respect to one of the NMOS transistors 35-2 and 36-2. After the storing of data for the second time, the NV word line NWL-B is activated to recall the second stored data from this NV cell 48. A choice as to which one of the NV word lines NWL-A through NWL-D is activated may be made by providing a nonvolatile memory in the X driver units 28-1 through 28-4 and by using this nonvolatile memory to indicate the number of times the storing of data has been performed with respect to an NV cell 48 of interest.

Further, the present invention is not limited to these embodiments, but various variations and modifications may be made without departing from the scope of the present invention.

What is claimed is:

1. A nonvolatile semiconductor memory device, comprising:
   a first latch configured to store data;
   a nonvolatile memory cell coupled to the first latch and including two MIS transistors to store data as an irreversible change of transistor characteristics occurring in one of the two MIS transistors selected in response to the data stored in the first latch;
   a second latch coupled to the nonvolatile memory cell and configured to store data obtained by sensing a difference in the transistor characteristics between the two MIS transistors of the nonvolatile memory cell;
   a logic circuit configured to produce a signal indicative of comparison between the data stored in the first latch and the data stored in the second latch; and
   a control circuit configured to repeat a store operation for storing data in the nonvolatile memory cell, a recall operation for storing data in the second latch, and a verify operation for producing the signal indicative of comparison until the signal indicates that the data stored in the first latch and the data stored in the second latch are the same.

2. The nonvolatile semiconductor memory device as claimed in claim 1, comprising a plurality of memory cell units arranged in rows and columns, each of which has an identical circuit configuration including the first latch, the nonvolatile memory cell, the second latch, and the logic circuit, and the control circuit is configured to repeat the store operation, the recall operation, and the verify operation each at once with respect to a specified one of the rows.

3. The nonvolatile semiconductor memory device as claimed in claim 1, comprising a plurality of memory cell units arranged in rows and columns, each of which has an identical circuit configuration including the first latch, the nonvolatile memory cell, the second latch, and the logic circuit, and the control circuit is configured to repeat the store operation, the recall operation, and the verify operation each at once with respect to all the memory cell units.

4. The nonvolatile semiconductor memory device as claimed in claim 1, further comprising a busy circuit configured to produce a busy signal responsive to the signal indicative of comparison between the data stored in the first latch and the data stored in the second latch, the busy signal being output to an exterior of the nonvolatile semiconductor memory device.

5. The nonvolatile semiconductor memory device as claimed in claim 1, wherein the control circuit is configured to start the store operation, the recall operation, and the verify operation in response to a trigger from an exterior of the nonvolatile semiconductor memory device, to thereafter continue repeating the store operation, the recall operation, and the verify operation on its own without a further input from the exterior of the nonvolatile semiconductor memory device, and to stops repeating the store operation, the recall operation, and the verify operation in response to the signal indicating that the data stored in the first latch and the data stored in the second latch are the same.

6. The nonvolatile semiconductor memory device as claimed in claim 1, wherein the control circuit is configured to perform the store operation at least once before coming to a halt in response to the signal indicating that the data stored in the first latch and the data stored in the second latch are the same.

7. The nonvolatile semiconductor memory device as claimed in claim 1, wherein the nonvolatile memory cell further includes one or more additional pairs of MIS transistors, the two MIS transistors and each of the additional pairs of MIS transistors being coupled to the first latch and the second latch, each of the additional pairs of MIS transistors configured to store data as an irreversible change of transistor characteristics occurring in one of two paired MIS transistors.

* * * * *